(12) United States Patent
Shoji et al.

(10) Patent No.: US 7,654,207 B1
(45) Date of Patent: Feb. 2, 2010

(54) XY STAGE

(75) Inventors: Maho Shoji, Tokyo (JP); Noriyuki Kubota, Tokyo (JP); Junichiro Oishi, Tokyo (JP)

(73) Assignee: NEC Corporation, Tokyo (JP)

( * ) Notice: Subject to any disclaimer, the term of this patent is extended or adjusted under 35 U.S.C. 154(b) by 2342 days.

(21) Appl. No.: 09/655,767

(22) Filed: Sep. 5, 2000

(30) Foreign Application Priority Data

Sep. 10, 1999 (JP) ................................ 11-256689
Dec. 22, 1999 (JP) ................................ 11-365343

(51) Int. Cl.
*A47B 85/00* (2006.01)
(52) U.S. Cl. ...................................................... 108/20
(58) Field of Classification Search .................. 108/20, 108/21, 22, 193; 74/16; 100/143
See application file for complete search history.

(56) References Cited

U.S. PATENT DOCUMENTS

| 4,193,317 | A | * | 3/1980 | Oono et al. |
| 5,117,761 | A | * | 6/1992 | Kasai et al. |
| 5,228,358 | A | * | 7/1993 | Sakino et al. |
| 5,874,820 | A |   | 2/1999 | Lee |
| 5,942,871 | A |   | 8/1999 | Lee |
| 5,962,937 | A |   | 10/1999 | Wavre |
| 6,244,192 | B1 | * | 6/2001 | Suzuki et al. |

FOREIGN PATENT DOCUMENTS

| JP | 62-34745 | * | 2/1987 |
| JP | 01-181537 |   | 7/1989 |
| JP | 1-291194 |   | 11/1989 |
| JP | 05-299464 |   | 11/1993 |
| JP | 08-213421 |   | 8/1996 |
| JP | 11-008263 |   | 1/1999 |
| JP | 11-148984 |   | 6/1999 |

OTHER PUBLICATIONS

Abstract of German Patent Application No. DE 3620-969-A.
Abstract of Patent Application No. DD-267-830-A.
Abstract of Japanese Patent Application No. 7115053-A.
Abstract of Great Britain Patent Application No. GB-2329518-A.
Abstract of Japanese Patent Application No. 09262727-A.

* cited by examiner

*Primary Examiner*—Jose V. Chen
(74) *Attorney, Agent, or Firm*—Muirhead and Saturnelli, LLC

(57) ABSTRACT

An XY stage comprises a base, a movable table which is disposed on the base so as to be movable in an X direction and a Y direction in an X-Y plane, and a work member which is provided on the movable table. The XY stage further comprises: a first linear motor for giving a driving force in the X direction to the movable table at the same height as the center of gravity of a movable section composed of the movable table and the work member; and a second linear motor for giving a driving force in the Y direction to the movable table at the same height as the center of gravity of the movable section.

23 Claims, 22 Drawing Sheets

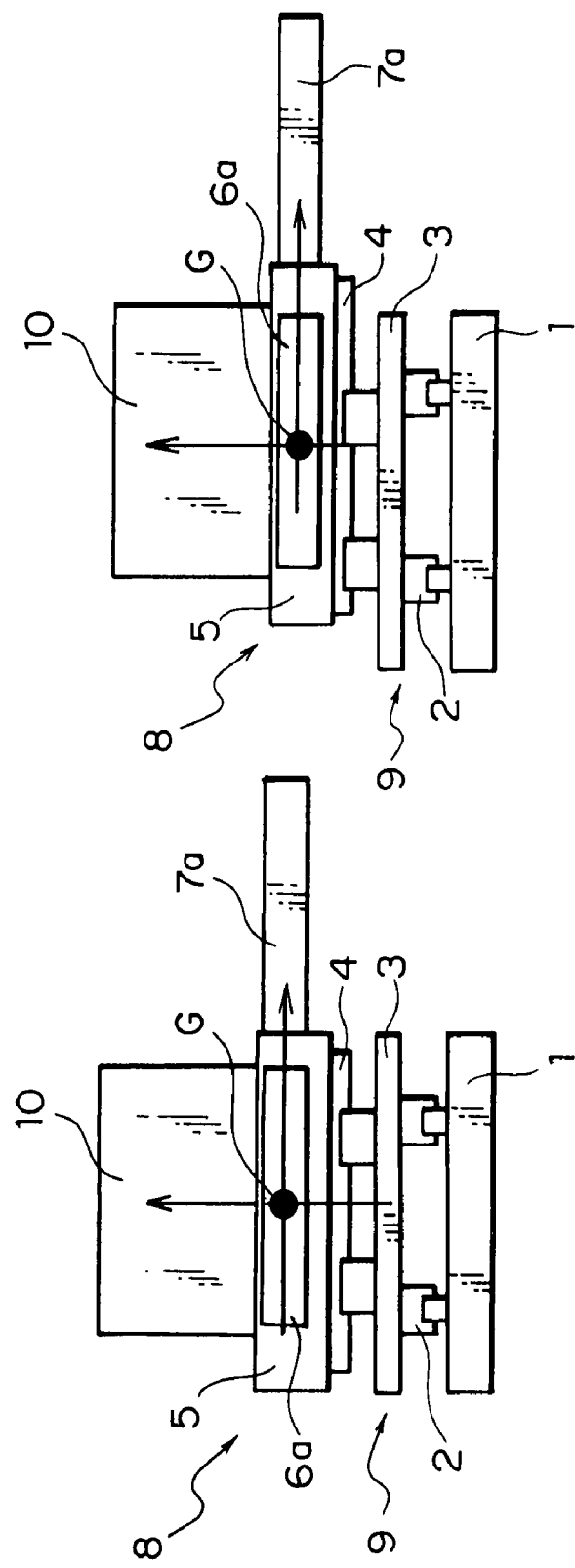

XY STAGE

BACKGROUND OF THE INVENTION

1. Field of the Invention

The present invention relates to an XY stage which is suitable for a wire bonder, and more particularly to an XY stage which prevents a vibration caused by a high-speed movement and improves the controllability.

2. Description of the Related Art

When a large-scale integrated circuit (LSI) or a semiconductor device is connected to a lead frame using gold wires or the like, a wire bonder having an XY stage has been used. Such an XY stage is required to realize a high-speed and highly accurate positioning and to have a low level of residual vibration after driving/stopping.

FIG. 1 is a schematic diagram illustrating a structure of a conventional wire bonder stage. FIG. 2 is a schematic diagram showing that a bonding head is attached onto the conventional wire bonder stage shown in FIG. 1.

In the conventional wire bonder stage, two X-axis guides 102 are provided on a square-plate-shaped base 101. The two X-axis guides 102 extend in a direction parallel to each other. This direction is referred to as an X-axis direction. An X-axis table 103 is provided on the X-axis guides 102. X-axis follower sections (not shown) for following the X-axis guides 102 are provided on the lower surface of the X-axis table 103. The X-axis table 103 can be moved in the X-axis direction. Two Y-axis guides 104 extending in a Y-axis direction which is perpendicular to the X-axis direction are provided on the upper surface of the X-axis table 103. A movable table 105 is provided on the Y-axis guides 104. Y-axis follower sections (not shown) for following the Y-axis guides 104 are provided on the lower surface of the movable table 105. The movable table 105 can be moved in the Y-axis direction and also in the X-axis direction because of the X-axis table 103 and the X-axis guides 102. The upper surface of the movable table 105 is a plane surface, and a bonding head 110 is fixed thereto.

An X-axis voice coil motor 106 (hereinafter, a voice coil motor is referred to as a VCM) is disposed so as to be adjacent to the movable table 105 in the X-axis direction. A Y-axis VCM 107 is disposed so as to be adjacent to the movable table 105 in the Y-axis direction.

The X-axis VCM 106 includes a yoke section 106c with a shape of a rectangular tube. The yoke section 106c is fixed to a support (not shown), and has an opening passing therethrough in a lateral direction. An iron core 106d is provided so as to divide the opening into two sections at an intermediate height of the yoke section 106c. The X-axis VCM 106 also includes an X-axis movable element 106a which is connected to the movable table 105, and a coil 106b which is wound around the X-axis movable element 106a. The coil 106b is wound so as to surround the iron core 106d. The lateral length of the coil 106b is about equal to or greater than a movable range of the movable table 105. The X-axis movable element 106a and the coil 106b can be moved without a constraint in the Y-axis direction. Magnets (not shown) are attached to the inner upper surface and inner bottom surface of the yoke section 106c so as to make a magnetic circuit which generates a magnetic field inside and around the coil 106b.

Likewise, The Y-axis VCM 107 includes a yoke section 107c having the shape of a rectangular tube. The yoke section 107c is fixed to the support, and has an opening passing therethrough in a lateral direction. An iron core 107d is provided so as to divide the opening into two sections at an intermediate height of the yoke section 107c. The Y-axis VCM 107 also includes a Y-axis movable element 107a which is connected to the movable table 105, and a coil 107b which is wound around the Y-axis movable element 107a. The coil 107b is wound so as to surround the iron core 107d. The lateral length of the coil 107b is about equal to or greater than the movable range of the movable table 105. The Y-axis movable element 107a and the coil 107b can be moved without a constraint in the X-axis direction. Magnets (not shown) are attached to an inner upper surface and an inner bottom surface of the yoke section 107c so as to make a magnetic circuit which generates a magnetic field inside and around the coil 107b.

The movable table 105 and the Y-axis movable element 107a together constitute an upper stage section 108, and the X-axis table 103 and the X-axis movable element 106a together constitute a middle stage section 109.

The mass of the bonding head 110 is greater than that of each of the upper stage section 108 and the middle stage section 109. As a result, when considering the bonding head 110 and the upper stage section 108 which are integrated with each other as a single member, the overall center of gravity of the bonding head 110, the upper stage section 108, and the middle stage section 109, which are members capable of moving in the X-axis and Y-axis directions, coincides approximately with the center of gravity of such an integrated member.

In the thus-structured conventional wire bonder stage, the middle stage section 109 follows the X-axis guides 102, thereby being guided in the X-axis direction with respect to the base 101. The upper stage section 108 follows the Y-axis guides 104, thereby being guided in the Y-axis direction with respect to the X-axis table 103, and is movable also in the X-axis direction together with the middle stage section 109.

Such an XY stage which two-dimensionally drives the movable section externally and indirectly via guides has a low level of positioning accuracy. In order to solve such a problem, there has been proposed an XY stage which directly positions a movable table (Japanese Patent Laid-Open Publication No. Hei 1-291194).

According to the XY stage described in this publication, two linear motors are provided on a base, and a coil of each of the linear motors is directly connected to the lower surface of a movable table. An L-shaped X-axis stage, which is guided in the X-axis direction by an X-axis guide rail and an X-axis linear guide, and the movable table are provided on the same plane. A straight line section of the X-axis stage functions as a Y-axis guide rail, and the movable table is guided in the Y-axis direction by the Y-axis guide rail and a Y-axis linear guide. A plane bearing is provided between the X-axis stage and the movable table, and the base. In this manner, the movable table is driven directly by the linear motors rather than via guides.

An XY stage including a link mechanism for holding a movable table in parallel to a base surface to realize a high-speed movement has been proposed (Japanese Patent Laid-Open Publication No. Hei 11-148984).

In the XY-stage described in this publication, two VCMs whose coils are fixed to the movable table are provided. A plurality of links are connected to the movable table, and the surface of the movable table is held in parallel to the surface of a base while the movable table is lifted up from the base. With such a structure, a single table is sufficient, thereby making it possible to downsize the XY stage itself.

According to the conventional wire bonder stage as shown in FIG. 1 and FIG. 2, the mass of the bonding head 110 is large as described above. Therefore, a moment is likely to occur during the operation, and thus the guides need to have a rigidity strong enough to withstand the moment. FIG. 3A and FIG. 3B show a change in the position of the center of gravity g of the movable section when the bonding head 110 is moved in the Y-axis direction. FIG. 3A is a schematic diagram showing the position of the center of gravity g before the movement, and FIG. 3B is a schematic diagram showing the position of the center of gravity g after the movement.

The bonding head 110 is generally heavier than each of the upper stage section 108 and the middle stage section 109, and total mass of the member composed of the bonding head 110 and the upper stage section 108 which are integrated with each other is greater than that of the middle stage section 109. As a result, when the upper stage section 108 and the bonding head 110 move in the Y-axis direction, the position of the center of gravity g of the movable section changes to a large degree as shown in FIG. 3A and FIG. 3B. Therefore, if the X-axis VCM 106 is driven under such a state, a driving force acts on a position significantly shifted from the center of gravity g of the movable section as viewed in a plan view. When the movable table 105 is moved in the X-axis direction, the position of the center of gravity g of the movable section changes in association with the position of the movable table 105 in the Y-axis direction. Therefore, a moment force is generated, causing a problematic vibration in a yawing direction. In the wire bonder, although a bonding step is performed immediately after the XY stage is stopped, the vibration as described above leads to a reduced positioning accuracy or the like, thereby significantly degrading the bondability. Thus, as described above, each of the X-axis guides 102 and the Y-axis guides 104 needs to have a rigidity strong enough to be able to hold a moment load due to the movement of the movable table 105 and the bonding head 110. Accordingly, the downsizing of the XY stage itself is difficult to achieve.

According to the conventional XY stage described in Japanese Patent Laid-Open Publication No. Hei 1-291194, since the height at which the VCM coil is positioned is different from the height at which the movable table is positioned, a driving force from the VCM does not act on the center of gravity of the movable section. Thus, it is difficult to sufficiently suppress the vibration caused by the high-speed movement of the movable stage.

Moreover, since a position detector is provided at a position above the movable table, the accuracy of the position detection is insufficient. Thus, position control may be difficult to perform.

Furthermore, according to the conventional XY stage described in Japanese Patent Laid-Open Publication No. Hei 11-148984, although the intended objective can be achieved, it is difficult to suppress the vibration in the yawing direction caused by the high-speed movement of the movable stage.

According to these conventional XY stages, since the vibration in the yawing direction occurs, a feedback control needs to be performed in order to reduce an influence due to the vibration. In addition, these conventional XY stages have the problem of a narrow control band.

Since the X-axis table 103, the Y-axis guides 104, the movable table 105, the Y-axis movable element 107a, and the coil 107b of the Y-axis VCM 107 are included among members on which a thrust from the X-axis VCM 106 acts, a very large VCM needs to be employed as the X-axis VCM 106 if a high thrust is required. Therefore, the force of inertia of the movable section as a whole becomes large, and the vibration in the yawing direction or the like which resonates at a low frequency becomes a problem.

SUMMARY OF THE INVENTION

An object of the present invention is to provide an XY stage capable of sufficiently suppressing a vibration generated after the high-speed movement of a movable section and capable of readily controlling the movement.

An XY stage according to the present invention comprises a base, a movable table disposed on said base so as to be movable in an X direction and a Y direction in an X-Y plane, a work member provided on said movable table, a first linear motor which gives a driving force in the X direction to said movable table at the same height as the center of gravity of a movable section composed of said movable table and said work member, and a second linear motor which gives a driving force in the Y direction to said movable table at the same height as the center of gravity of said movable section.

In the XY stage, the work member may be, for example, a bonding head and may be used for wire bonding.

According to the present invention, when the movable section is driven by the linear motors, a force from the linear motors acts on the center of gravity of the movable section. Therefore, even when the position of the movable table is shifted in a direction perpendicular to the driving direction, the center of gravity driving is always achieved. Thus, even when the movable table is moved at a high speed, substantially no moment force is generated, and thus substantially no vibration in the yawing direction is generated. Accordingly, even when using a guide member having rigidity lower than that of the conventional guide member for guiding the movable section, a stable operation can be obtained, thereby making it possible to lighten and downsize the XY stage. Moreover, since the vibration in the yawing direction is suppressed, the controllable frequency band is broadened.

In particular, if the movable section and the movable elements of the linear motors of the respective axes are movable independently of each other, redundancy (a margin for movement) can be reduced and the number of members on which the thrust acts can also be reduced. Thus, the linear motors can be downsized. Accordingly, the force of inertia of the movable section is reduced and the eigenfrequency thereof is increased, thereby further facilitating the suppression of the vibration.

The nature, principle, and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 3A is a schematic diagram showing the position of the center of gravity g before the movement; and FIG. 3B is a schematic diagram showing the position of the center of gravity g after the movement;

FIG. 6A is a plan view thereof; and FIG. 6B is a cross-sectional view of FIG. 6A along a line A-A;

FIG. 7A and FIG. 7B are views showing a change in the position of the center of gravity G of a movable section when a bonding head 10 is moved in the Y-axis direction; FIG. 7A is a schematic diagram showing the position of the center of gravity G before the movement; and FIG. 7B is a schematic diagram showing the position of the center of gravity G after the movement;

FIG. 9A is the graph showing the relationship between the gain and the frequency; and FIG. 9B is the graph showing the relationship between the phase and the frequency;

FIG. 10A is the graph showing the relationship between the gain and the frequency; and FIG. 10B is the graph showing the relationship between the phase and the frequency;

FIG. 13A is the graph showing the relationship between the gain and the frequency; and FIG. 13B is the graph showing the relationship between the phase and the frequency;

FIG. 14A is the graph showing the relationship between the gain and the frequency; and FIG. 14B is the graph showing the relationship between the phase and the frequency;

FIG. 18A is a plan view thereof; and FIG. 18B is a cross-sectional view of FIG. 18A along a line B-B;

DETAILED DESCRIPTION OF THE PREFERRED EMBODIMENT

Figure 1:
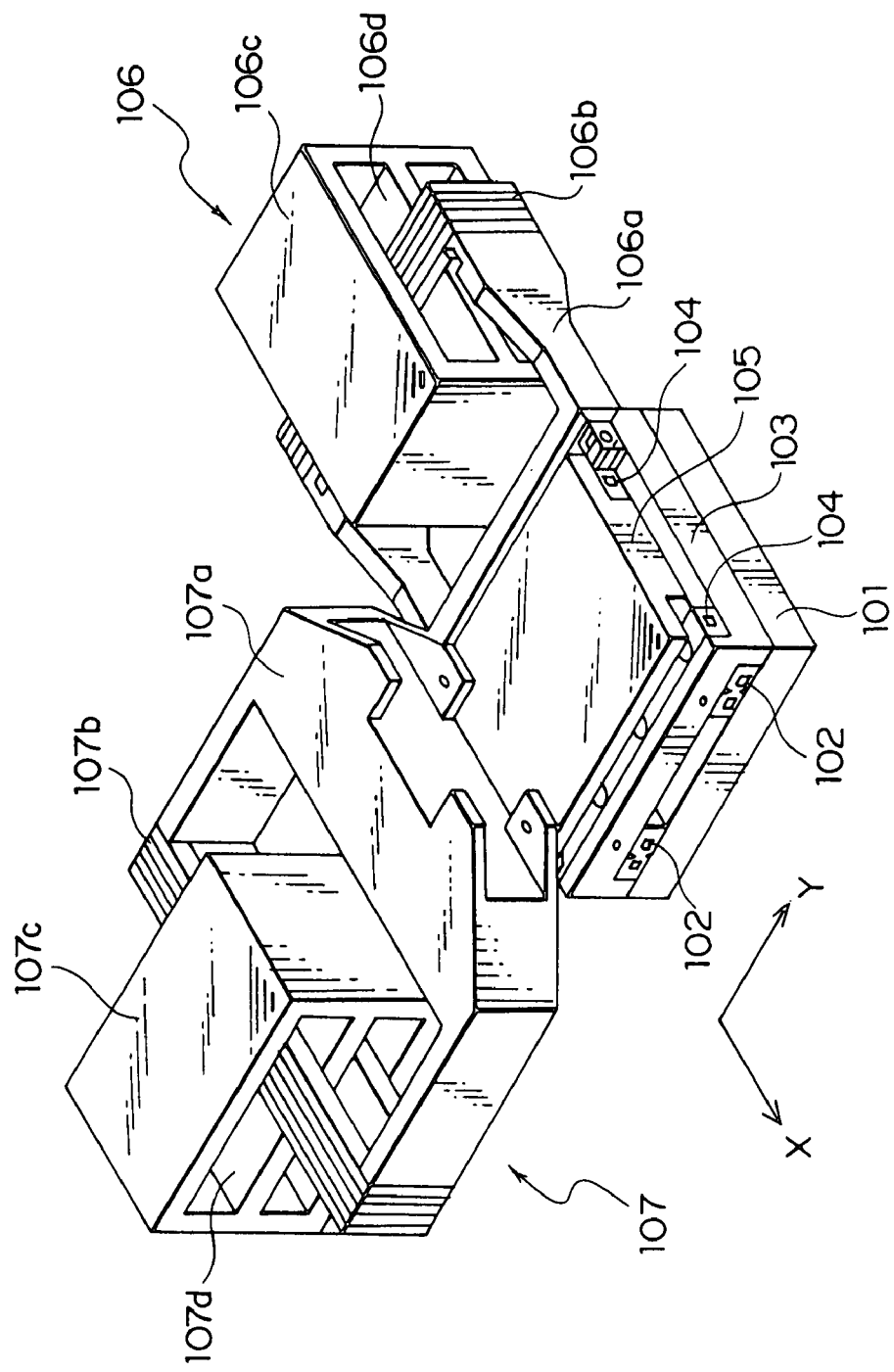
FIG. 1 is a schematic diagram showing the structure of a conventional wire bonder stage.
Figure 2:
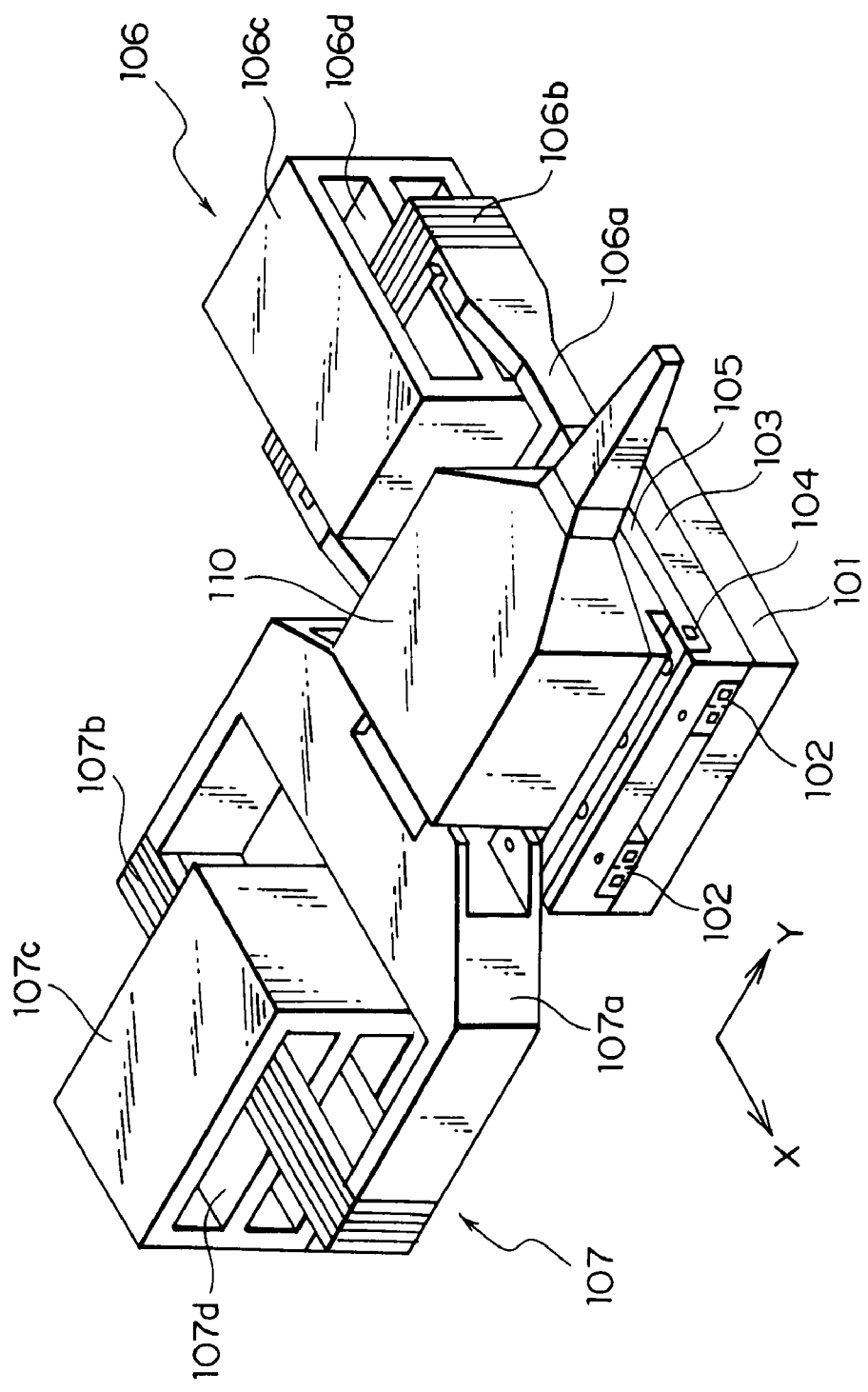
FIG. 2 is a schematic diagram showing that a bonding head is attached onto the conventional wire bonder stage shown in FIG. 1.
Figure 3:
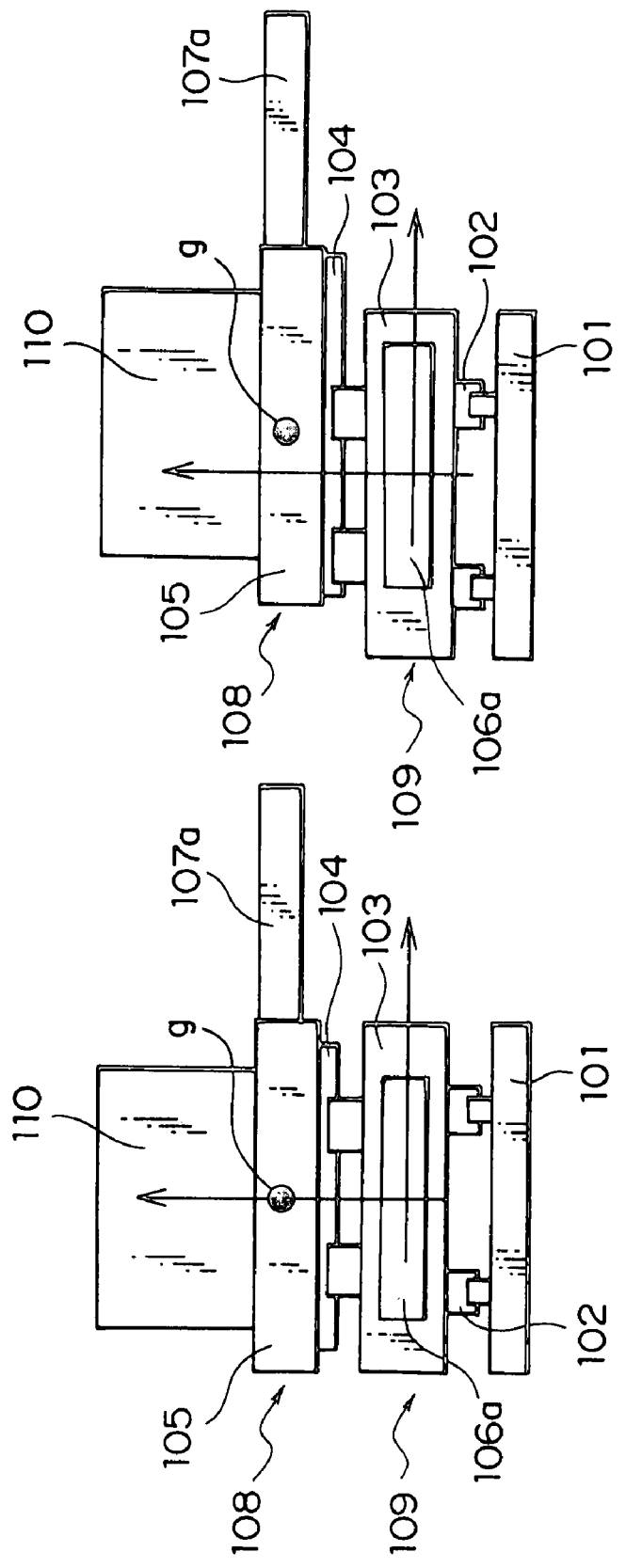
FIG. 3A and FIG. 3B are views showing a change in the position of the center of gravity g of a movable section when the bonding head 110 is moved in the Y-axis direction.
Figure 4:
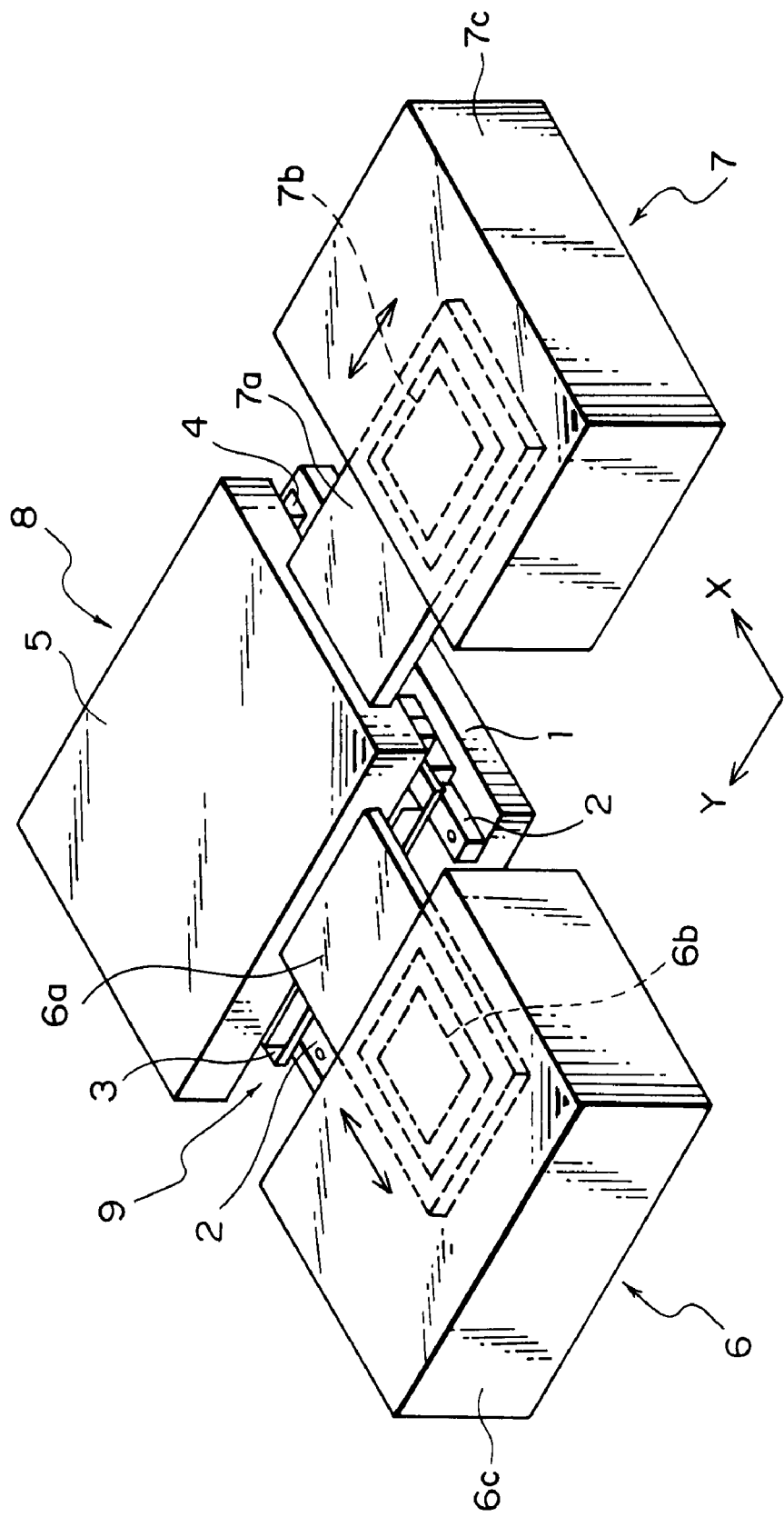
FIG. 4 is a schematic diagram showing the structure of a wire bonder stage according to a first embodiment of the present invention.
Figure 5:
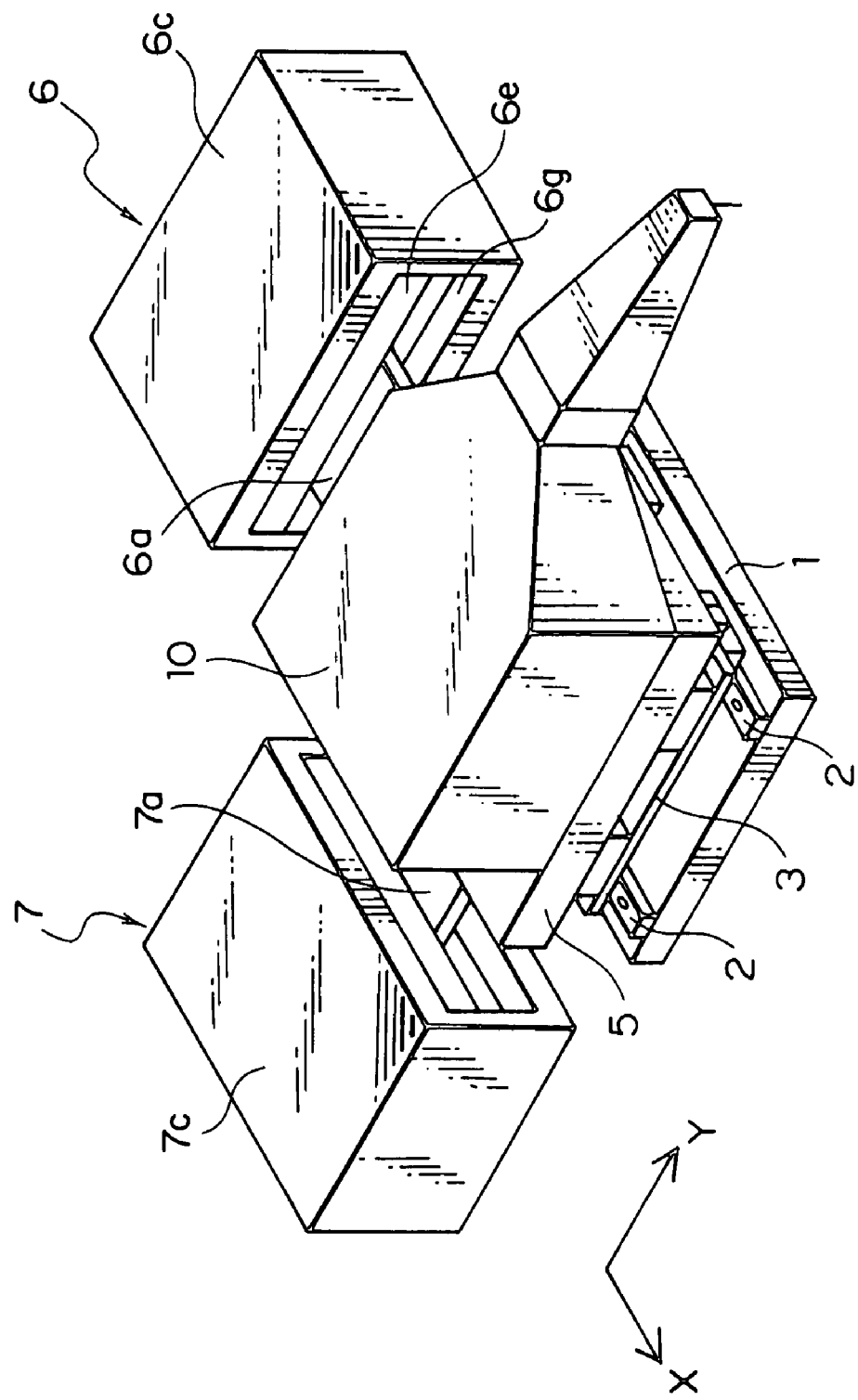
FIG. 5 is a schematic diagram showing that a bonding head is attached onto the wire bonder stage shown in FIG. 4.

The preferred embodiments of the present invention will be described below specifically with reference to the accompanying drawings. FIG. 4 is a schematic diagram showing the structure of a wire bonder stage according to the first embodiment of the present invention. FIG. 5 is a schematic diagram showing that a bonding head is attached onto the wire bonder stage shown in FIG. 4.

According to the present embodiment, two X-axis guides (first guide members) 2 are provided on a square-plate-shaped base 1, for example. The two X-axis guides 2 extend in a direction parallel to each other. This direction is referred to as an X-axis direction. An X-axis table (middle table) 3 is provided on the X-axis guides 2. X-axis follower sections (not shown) for following the X-axis guides 2 are provided on the lower surface of the X-axis table 3. The X-axis table 3 can be moved in the X-axis direction. Two Y-axis guides (second guide members) 4 extending in a Y-axis direction which is perpendicular to the X-axis direction are provided on the upper surface of the X-axis table 3. A movable table 5 is provided on the Y-axis guides 4. Y-axis follower sections (not shown) for following the Y-axis guides 4 are provided on the lower surface of the movable table 5. The movable table 5 can be moved in the Y-axis direction and also in the X-axis direction because of the X-axis table 3 and the X-axis guides 2. The upper surface of the movable table 5 is a plane surface, and a bonding head (work member) 10 is fixed thereto.

Figure 6A:
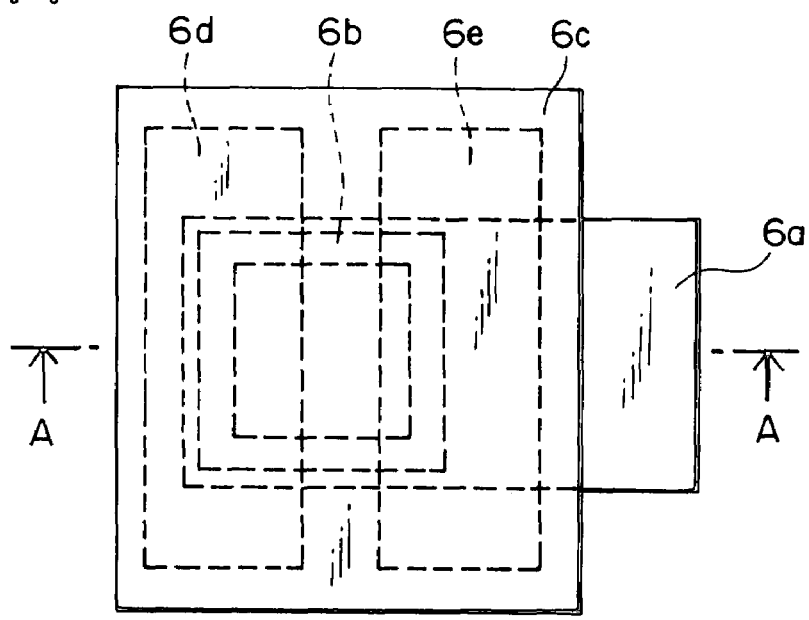
FIG. 6A and FIG. 6B are views showing the structure of an X-axis VCM 6.
Figure 6B:
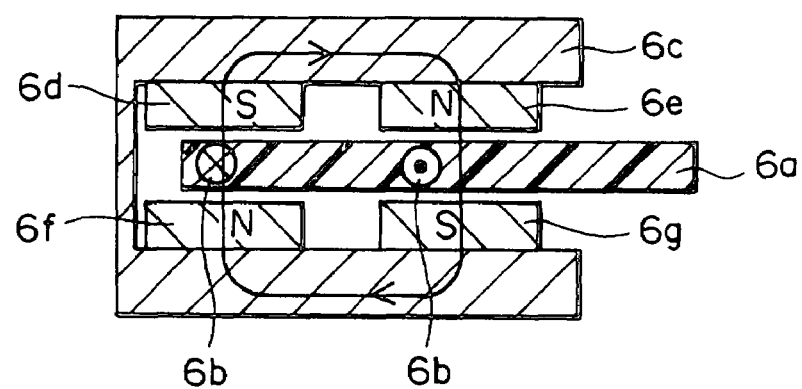

An X-axis VCM (linear motor) 6 is disposed so as to be adjacent to the movable table 5 in the X-axis direction. FIG. 6A and FIG. 6B are views showing the structure of the X-axis VCM 6. FIG. 6A is a plan view thereof, and FIG. 6B is a cross-sectional view of FIG. 6A along the line A-A.

The X-axis VCM 6 includes a yoke section 6c which is fixed to the support (not shown) and has an opening at the side of the movable table 5. An X-axis movable element 6a which is connected to a side surface of the movable table 5 and a coil 6b which is wound around the X-axis movable element 6a are inserted into the yoke section 6c from the opening. The coil 6b is wound so as to be parallel to the surface of the movable table 5. The size of the opening is about equal to or greater than a movable range of the movable table 5 in the Y-axis direction. The X-axis movable element 6a and the coil 6b can be moved without a constraint in the Y-axis direction. A magnet 6d whose south pole faces down and a magnet 6e whose north pole faces down are attached to the inner upper surface of the yoke section 6c. A magnet 6f whose north pole faces up and a magnet 6g whose south pole faces up are attached to the inner bottom surface of the yoke section 6c at positions respectively opposing the magnets 6d and 6e. Accordingly, a magnetic circuit which generates a magnetic field inside and around the coil 6b is made in the X-axis VCM 6.

In the thus-structured X-axis VCM 6, a magnetic field as indicated by an arrow shown in FIG. 6B is generated. If a current flows through the coil 6b in a direction as shown in FIG. 6B, the X-axis movable element 6a moves in the right direction in the figure.

A Y-axis VCM (linear motor) 7 is disposed so as to be adjacent to the movable table 5 in the Y-axis direction. As in the X-axis VCM 6, the Y-axis VCM 7 includes a yoke section 7c which is fixed to the support and has an opening at the side of the movable table 5. A Y-axis movable element 7a which is connected to a side surface of the movable table 5 and a coil 7b which is wound around the Y-axis movable element 7a are inserted into the yoke section 7c from the opening. The coil 7b is wound so as to be parallel to the surface of the movable table 5. The size of the opening is about equal to or greater than a movable range of the movable table 5 in the X-axis direction. The Y-axis movable element 7a and the coil 7b can be moved without a constraint in the X-axis direction. As in the X-axis VCM 6, a magnetic circuit which generates a magnetic field inside and around the coil 7b is made in the Y-axis VCM 7.

The movable table 5 including the Y-axis follower sections, the X-axis movable element 6a and the Y-axis movable element 7a together constitute an upper stage section 8, and the X-axis table 3 including the X-axis follower sections and the Y-axis guides 4 together constitute a middle stage section 9. The movable table 5 and the bonding head 10 together constitute a movable section.

The mass of the bonding head 10 is greater than that of each of the upper stage section 8 and the middle stage section 9. Thus, when considering the bonding head 10 and the upper stage section 8 which are integrated with each other as a single member, the overall center of gravity of the movable section composed of the bonding head 10, the upper stage section 8, and the middle stage section 9, which are members capable of moving in the X-axis and Y-axis directions, coincides approximately with the center of gravity of such an integrated member. Therefore, whether the bonding head 10 is moved in the X-axis direction or the Y-axis direction, the position of the center of gravity is simultaneously moved in the same direction substantially by the same distance.

An X-axis direction position detector (not shown) for detecting a relative position in the X-axis direction with respect to the base 1 of the movable section is attached on the lower surface of the X-axis table 3. A Y-axis direction position detector (not shown) for detecting a relative position in the Y-axis direction with respect to the base 1 of the movable section is attached on the lower surface of the movable table 5. A straight line which passes through the position at which the X-axis direction position detector is attached and which is parallel to the X-axis direction substantially overlaps with a straight line which passes through the center of gravity of the movable section and which is parallel to the X-axis direction as viewed in a plan view. A straight line which passes through the position at which the Y-axis direction position detector is attached and which is parallel to the Y-axis direction substantially overlaps with a straight line which passes through the center of gravity of the movable section and which is parallel to the Y-axis direction as viewed in a plan view. As the X-axis direction position detector and the Y-axis direction position detector, a one-dimensional optical sensor and a magnetic sensor, for example, may be used. In the case where the optical sensor is used, scale marks that respectively indicate amounts of movement in the X-axis and Y-axis directions may be provided on the surface of the base 1 opposing the optical sensor.

A position detector of a two-dimensional optical sensor capable of detecting the amount of movement in a plane may be used instead of the X-axis direction position detector and the Y-axis direction position detector. In such a case, the position detector may be attached to the lower surface of the movable table 5, and scale marks which respectively indicate amounts of movement in the X-axis and Y-axis directions may be provided on the surface of the base 1.

Next, the operation of the thus-structured wire bonder stage of the first embodiment will be described. FIG. 7A and FIG. 7B are views showing a change in the position of the center of gravity G of a movable section when the bonding head 10 is moved in the Y-axis direction. FIG. 7A is a schematic diagram showing the position of the center of gravity G before the movement, and FIG. 7B is a schematic diagram showing the position of the center of gravity G after the movement.

In the case where the movable table 5 is moved in the Y-axis direction, the Y-axis VCM 7 is driven. Accordingly, the movable table 5 follows the Y-axis guides 4, thereby being guided in the Y-axis direction with respect to the X-axis table 3. Then, even if the position of the movable table 5 in the X-axis direction changes, the Y-axis movable element 7a can be moved without a constraint in the X-axis direction. Since the total mass of the member composed of the bonding head 10 and upper stage section 8 which are integrated with each other is greater than that of the middle stage section 9, the position of the center of gravity G of the movable section is not substantially changed. Thus, a force from the Y-axis VCM 7 acts on the position of the center of gravity G of the movable section.

In the case where the movable table 5 is moved in the X-axis direction, the X-axis VCM 6 is driven. Accordingly, the X-axis table 3 follows the X-axis guides 2, thereby being guided in the X-axis direction with respect to the base 1, and the movable table 5 provided thereon is thus moved in the X-axis direction. Then, even if the position of the upper stage section 8 in the Y-axis direction changes, the X-axis movable element 6a which is directly connected to the movable table 5 can be moved without a constraint in the Y-axis direction. As a result, the position of the center of gravity G of the movable section is not changed substantially. Thus, a force from the X-axis VCM 6 acts on the position of the center of gravity G of the movable section.

Thus, according to the wire bonder stage of this embodiment, whether the movable table 5 is moved in the X-axis direction or the Y-axis direction, the position of the center of gravity G does not substantially change, thereby ensuring the center-of-gravity driving. Thus, substantially no moment force is generated. Therefore, for example, when the movable table 5 is moved in the Y-axis direction, it is only necessary to consider the rigidity of the Y-axis guides 4 in the X-axis translational direction for the vibration in the X-Y plane because the yawing peak is small due to the positional transfer characteristics with respect to the VCM driving force in the X-axis direction. When the movable section is driven in the Y-axis direction, the rigidity for supporting the moment load does not have to be considered. Since the rigidity in the translational direction is generally greater than that in the yawing direction, a guide having rigidity lower than that of a conventional guide can be safely used for each of the X-axis guides 2 and the Y-axis guides 4 in this embodiment. When guides with a low rigidity are used, it is possible to downsize the guides, and thus a portion holding the guides can also be downsized. As a result, the total mass of the movable section can be reduced, thereby increasing the speed at which the movable section can be moved.

Figure 8A:
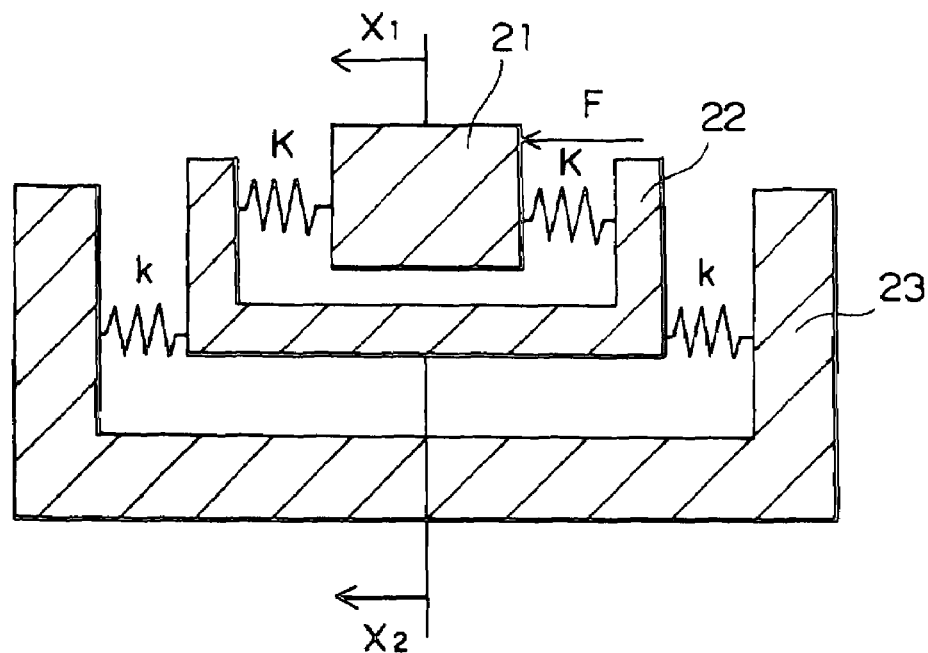
FIG. 8A is a schematic diagram showing a model such that an X-axis movable element is connected to an X-axis table as in the conventional case.
Figure 8B:
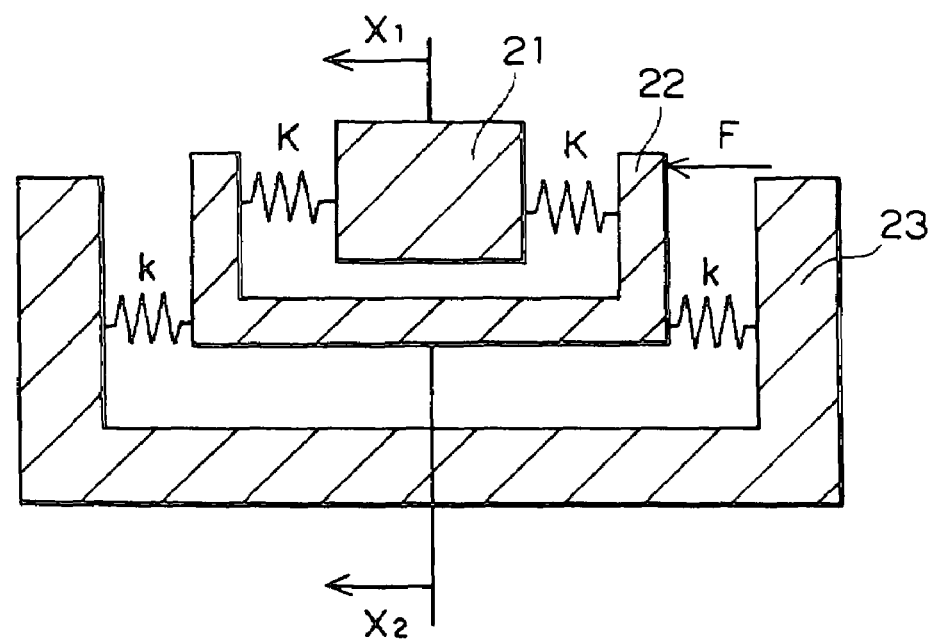
FIG. 8B is a schematic diagram showing a model such that the X-axis movable element is connected to the movable table as in the embodiment of the present invention.

As a result of directly connecting the X-axis movable element 6a and the Y-axis movable element 7a to the side surfaces of the upper stage section 8, the vibration caused by the guides can be suppressed. FIG. 8A is a schematic diagram showing a model such that an X-axis movable element is connected to an X-axis table as in the conventional case, and FIG. 8B is a schematic diagram showing a model such that the X-axis movable element is connected to the movable table as in the embodiment of the present invention.

The equations of motion of the member 21 composed of the upper stage section and the bonding head and the middle stage section 22 in the model shown in FIG. 8A are represented respectively by Expressions 1 and 2 below.

Expression 1:

$$M \frac{d^2 x_1}{dt^2} = -K(x_1 - x_2)$$

Expression 2:

$$M \frac{d^2 x_2}{dt^2} = F - kx_2 + K(x_1 - x_2)$$

In the above expressions, M is the total mass of the member 21; m is the mass of the middle stage section 22; K is the rigidity value of the Y-axis guides provided on the middle stage section 22; k is the rigidity value of the X-axis guides provided on a base 23; and F is the driving force by the X-axis VCM.

The resonance frequency ω in this model is represented by Expression 3 below.

Expression 3:

$$\omega = \sqrt{\frac{m+M}{mM} K}$$

The equations of motion of the member 21 consisting of the upper stage section and the bonding head and the middle stage section 22 in the model shown in FIG. 8B are represented respectively by Expressions 4 and 5 below.

Expression 4:

$$M \frac{d^2 x_1}{dt^2} = F - K(x_1 - x_2)$$

Expression 5:

$$M \frac{d^2 x_2}{dt^2} = -kx_2 + K(x_1 - x_2)$$

The resonance frequency ω in this model is represented by the following Expression 6 as in the model shown in FIG. 8A.

Expression 6:

$$\omega = \sqrt{\frac{m+M}{mM} K}$$

In either model, the rigidity value k is equal to that obtained in the sliding direction, i.e., 0.

Figure 9A:
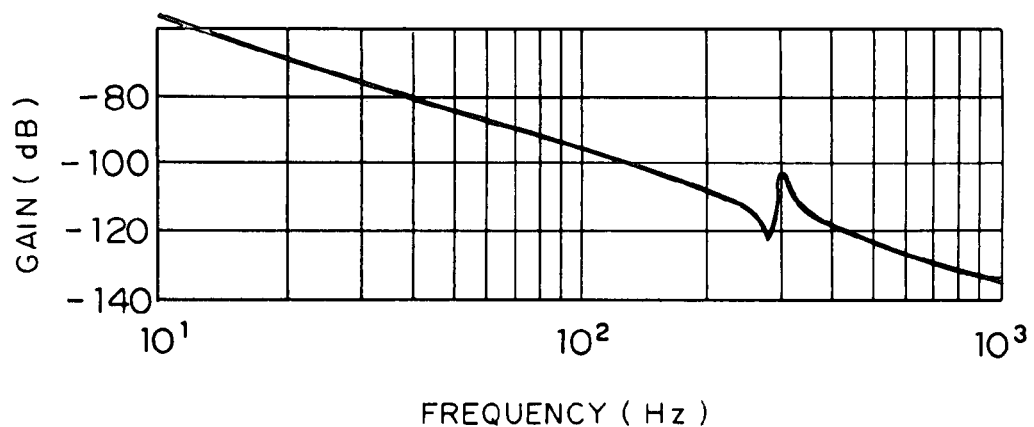
FIG. 9A and FIG. 9B are graphs each showing frequency characteristics when the mass m of a middle stage section 22 is equal to the total mass M of a member 21.
Figure 9B:
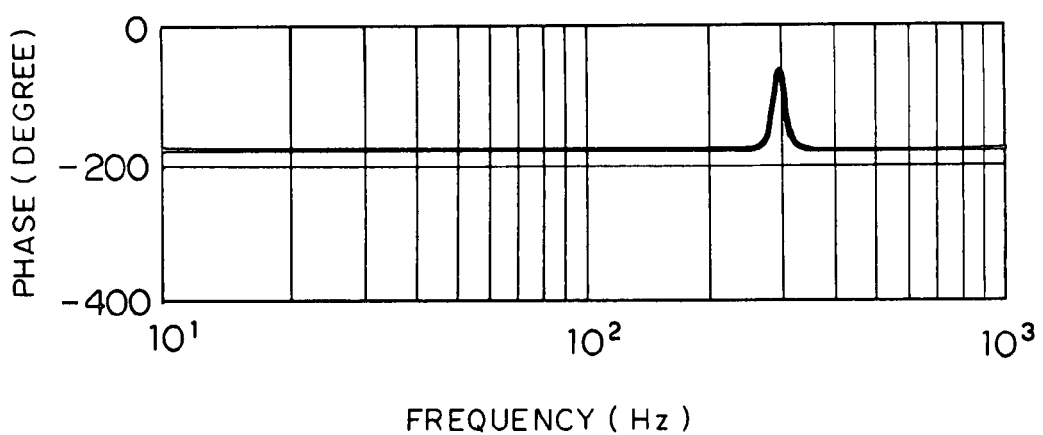
Figure 10A:
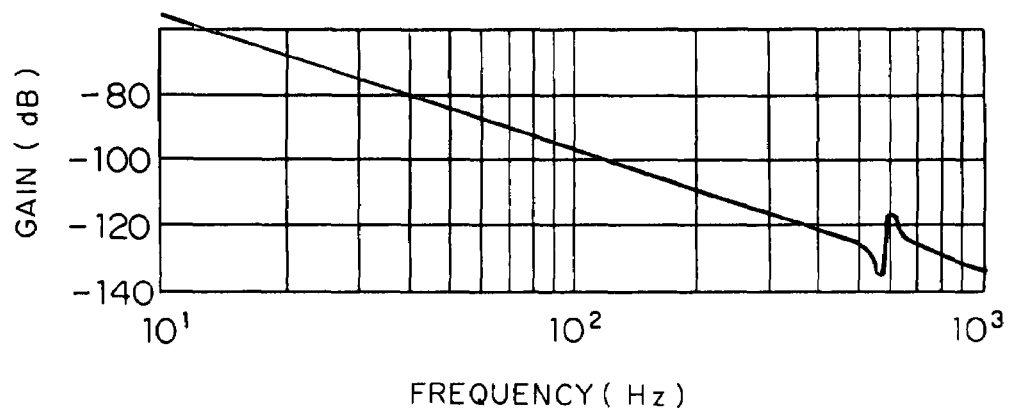
FIG. 10A and FIG. 10B are graphs each showing frequency characteristics when the mass m of the middle stage section 22 is less than the total mass M of the member 21.
Figure 10B:
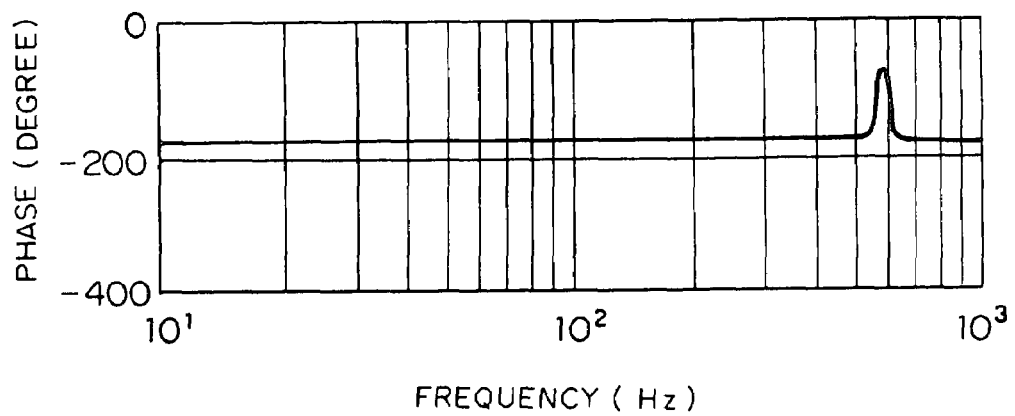
Figure 11A:
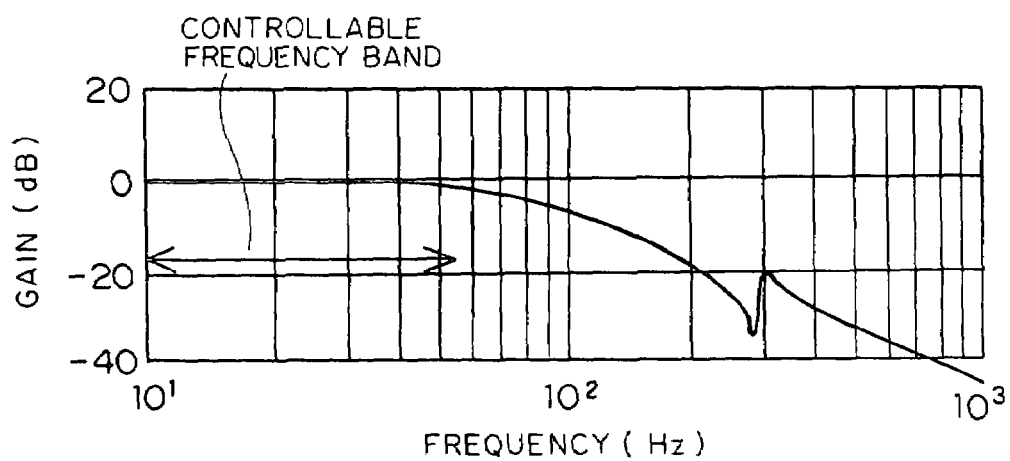
FIG. 11A and FIG. 11B are graphs showing closed loop characteristics respectively for FIG. 9A and FIG. 9B.
Figure 11B:
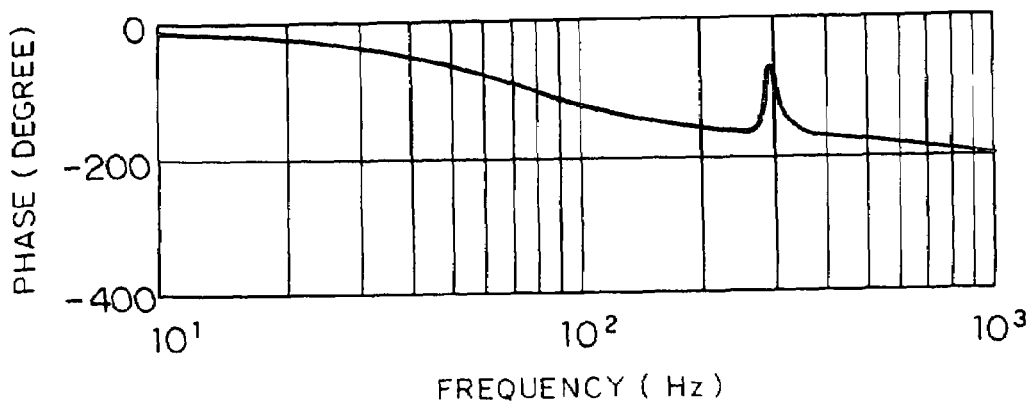
Figure 12A:
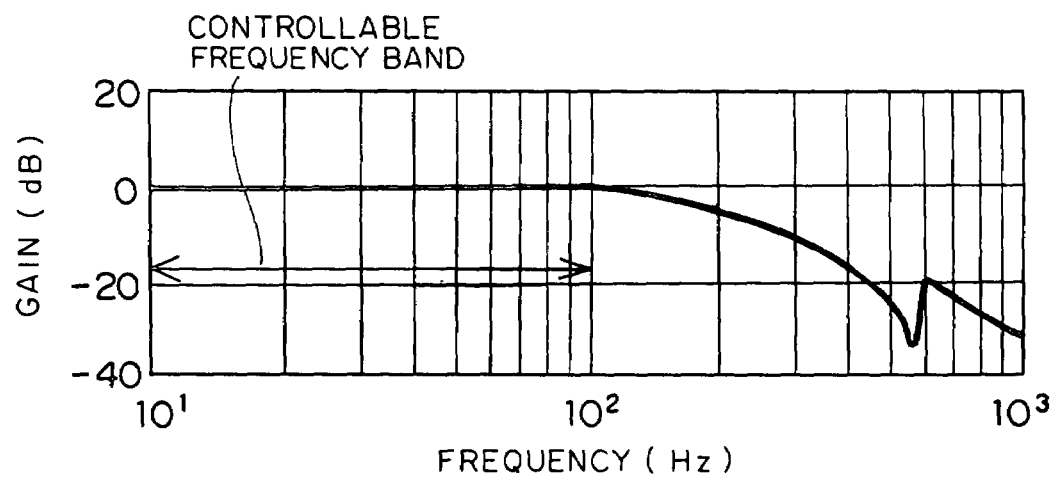
FIG. 12A and FIG. 12B are graphs showing closed loop characteristics respectively for FIG. 10A and FIG. 10B.
Figure 12B:
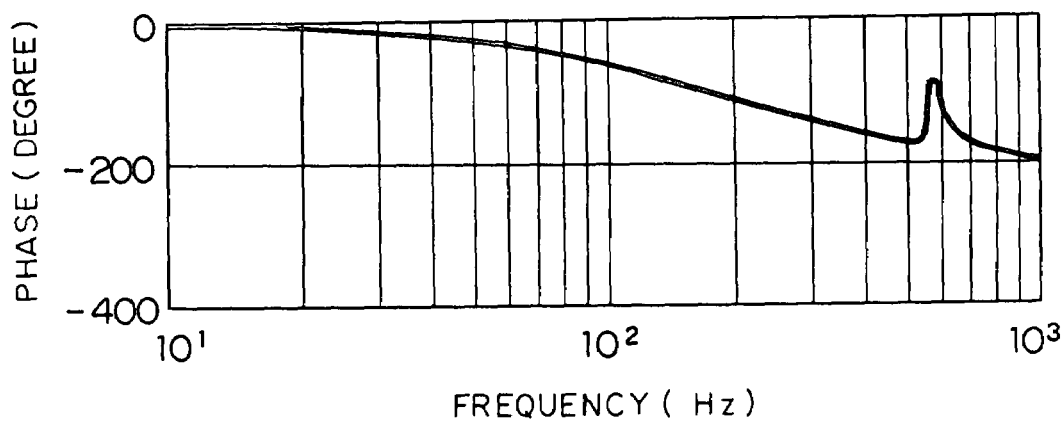

FIG. 9A and FIG. 9B are graphs each showing frequency characteristics when the mass m of the middle stage section 22 is equal to the total mass M of the member 21. FIG. 9A is the graph showing the relationship between the gain and the frequency, and FIG. 9B is the graph showing the relationship between the phase and the frequency. FIG. 10A and FIG. 10B are graphs each showing frequency characteristics when the mass m of the middle stage section 22 is less than the total mass M of the member 21. FIG. 10A is the graph showing the relationship between the gain and the frequency, and FIG. 10B is the graph showing the relationship between the phase and the frequency. FIG. 11A and FIG. 11B are graphs showing closed loop characteristics respectively for FIG. 9A and FIG. 9B, and FIG. 12A and FIG. 12B are graphs showing closed loop characteristics respectively for FIG. 10A and FIG. 10B.

From Expressions 3 and 6, if the total mass of the movable section composed of the member 21 composed of the upper stage section and the bonding head and the middle stage section 22 is constant, the resonance frequency ω is minimum as shown in FIG. 9A and FIG. 9B when the mass m of the middle stage section 22 is equal to the total mass M of the member 21. The bonding head of the wire bonder is generally heavier than each of the upper stage section and the middle stage section, and the total mass of the member 21 is greater than that of the middle stage section 22.

In the above-described embodiment of the present invention, since the X-axis movable element 6a and the Y-axis movable element 7a are directly connected to the upper stage section 8, the total mass of the member composed of the upper stage section 8 and the bonding head 10 is greater with respect to the mass of the middle stage section as compared to a case where a movable element of a VCM for driving in one of the axial directions is connected to the middle stage section 9. Thus, if the mass of the entire movable section is constant, the eigenfrequency (resonance frequency) is increased as shown in FIG. 10A and FIG. 10B. When a feedback control is performed for the XY stage, the eigenfrequency increases, which may cause a problem in terms of control ability. As can be seen from a comparison between FIG. 11A and FIG. 11B, and FIG. 12A and FIG. 12B, the control band is broadened, thereby improving the controllability.

Figure 13A:
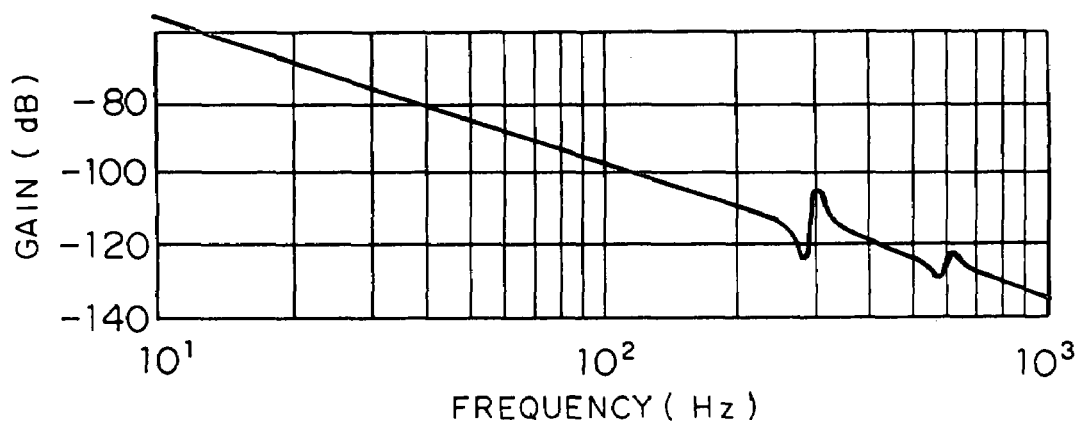
FIG. 13A and FIG. 13B are graphs each showing frequency characteristics in the conventional wire bonder stage.
Figure 13B:
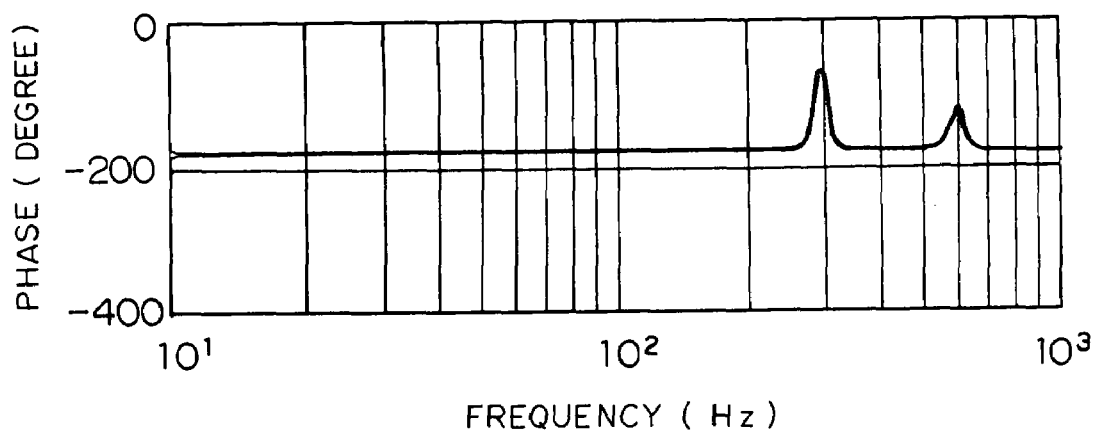
Figure 14A:
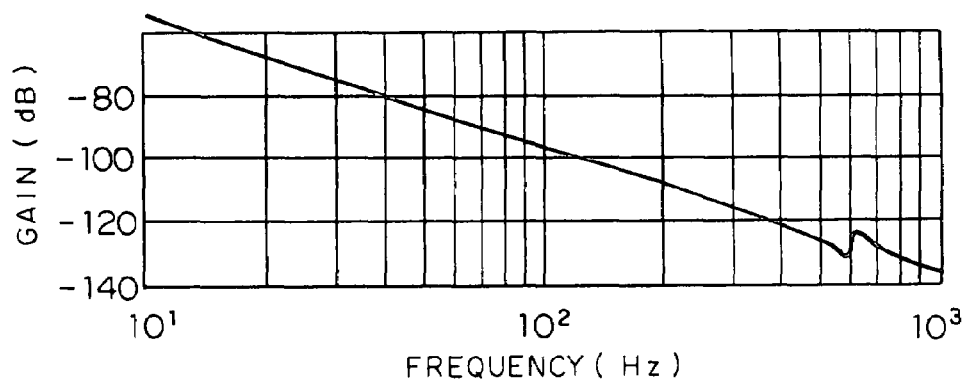
FIG. 14A and FIG. 14B are graphs each showing frequency characteristics in the wire bonder stage according to the embodiment of the present invention.
Figure 14B:
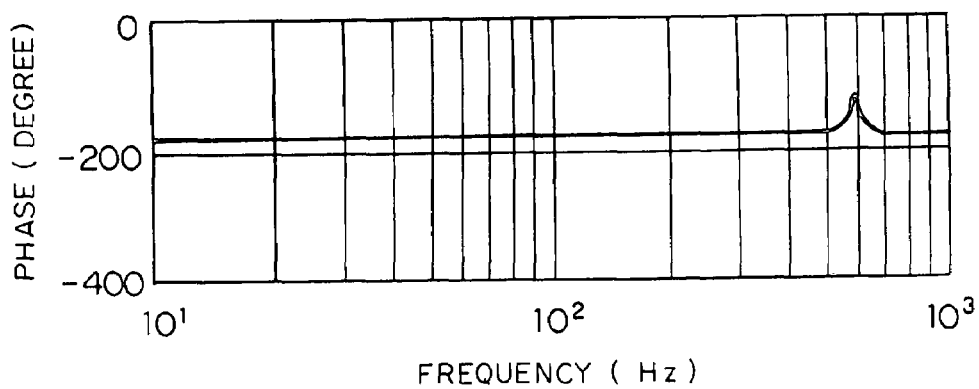
Figure 15A:
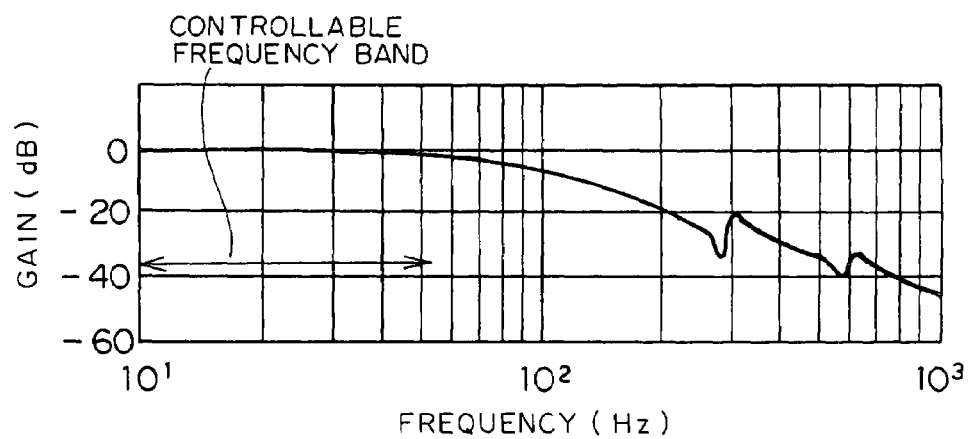
FIG. 15A and FIG. 15B are graphs showing closed loop characteristics respectively for FIG. 13A and FIG. 13B.
Figure 15B:
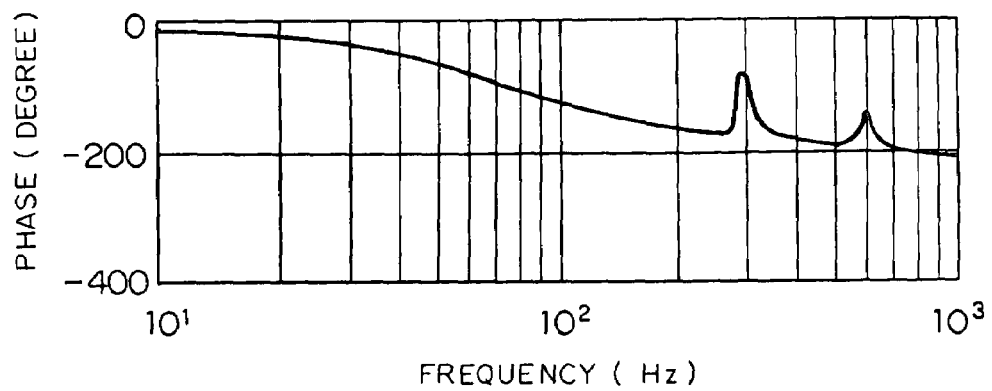
Figure 16A:
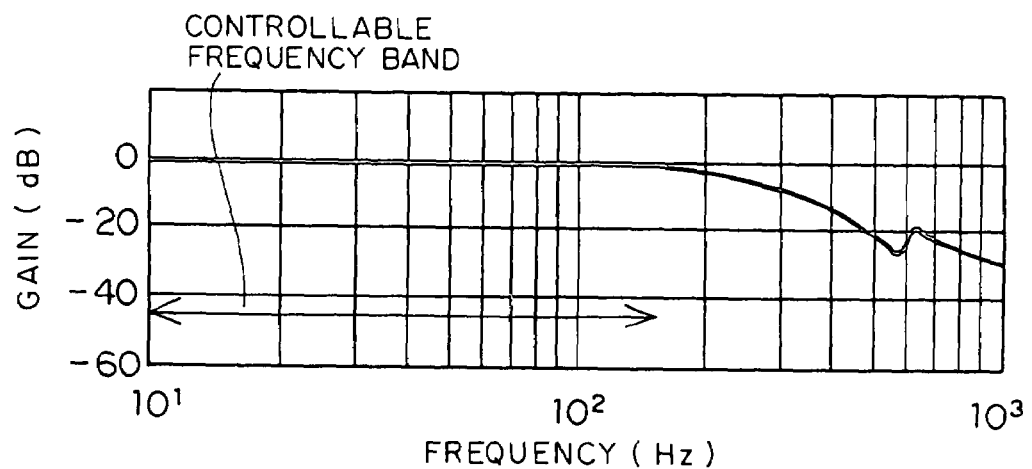
FIG. 16A and FIG. 16B are graphs showing closed loop characteristics respectively for FIG. 14A and FIG. 14B.
Figure 16B:
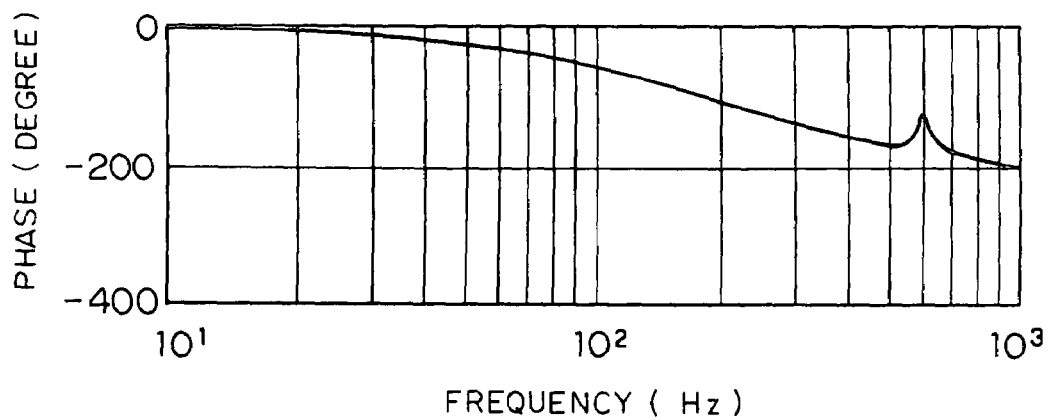

According to the present embodiment, the vibration in the yawing direction can be suppressed as described above. The effects thereof will be described below with reference to the drawings. FIG. 13A and FIG. 13B are graphs each showing frequency characteristics in a conventional wire bonder stage. FIG. 13A is the graph showing the relationship between the gain and the frequency, and FIG. 13B is the graph showing the relationship between the phase and the frequency. FIG. 14A and FIG. 14B are graphs each showing frequency characteristics in the wire bonder stage according to the embodiment of the present invention. FIG. 14A is the graph showing the relationship between the gain and the frequency, and FIG. 14B is the graph showing the relationship between the phase and the frequency. FIG. 15A and FIG. 15B are graphs showing closed loop characteristics respectively for FIG. 13A and FIG. 13B. FIG. 16A and FIG. 16B are graphs showing closed loop characteristics respectively for FIG. 14A and FIG. 14B.

In the conventional wire bonder stage, the vibration in the yawing direction occurs because the center-of-gravity driving is not achieved, and such a vibration has been a problem in terms of control ability. The vibration in the yawing direction occurs at a frequency lower than that of the vibration in the translational direction as shown in FIG. 13A and FIG. 13B. On the other hand, according to the embodiment of the present invention, since the movable section is driven at the center of gravity thereof, the vibration in the yawing direction is suppressed as shown in FIG. 14A and FIG. 14B. Since the control is less susceptible to the influence of mechanical resonance peak, a stable and broad control band can be obtained as can be seen from a comparison between FIG. 15A and FIG. 15B, and FIG. 16A and FIG. 16B.

Figure 17:
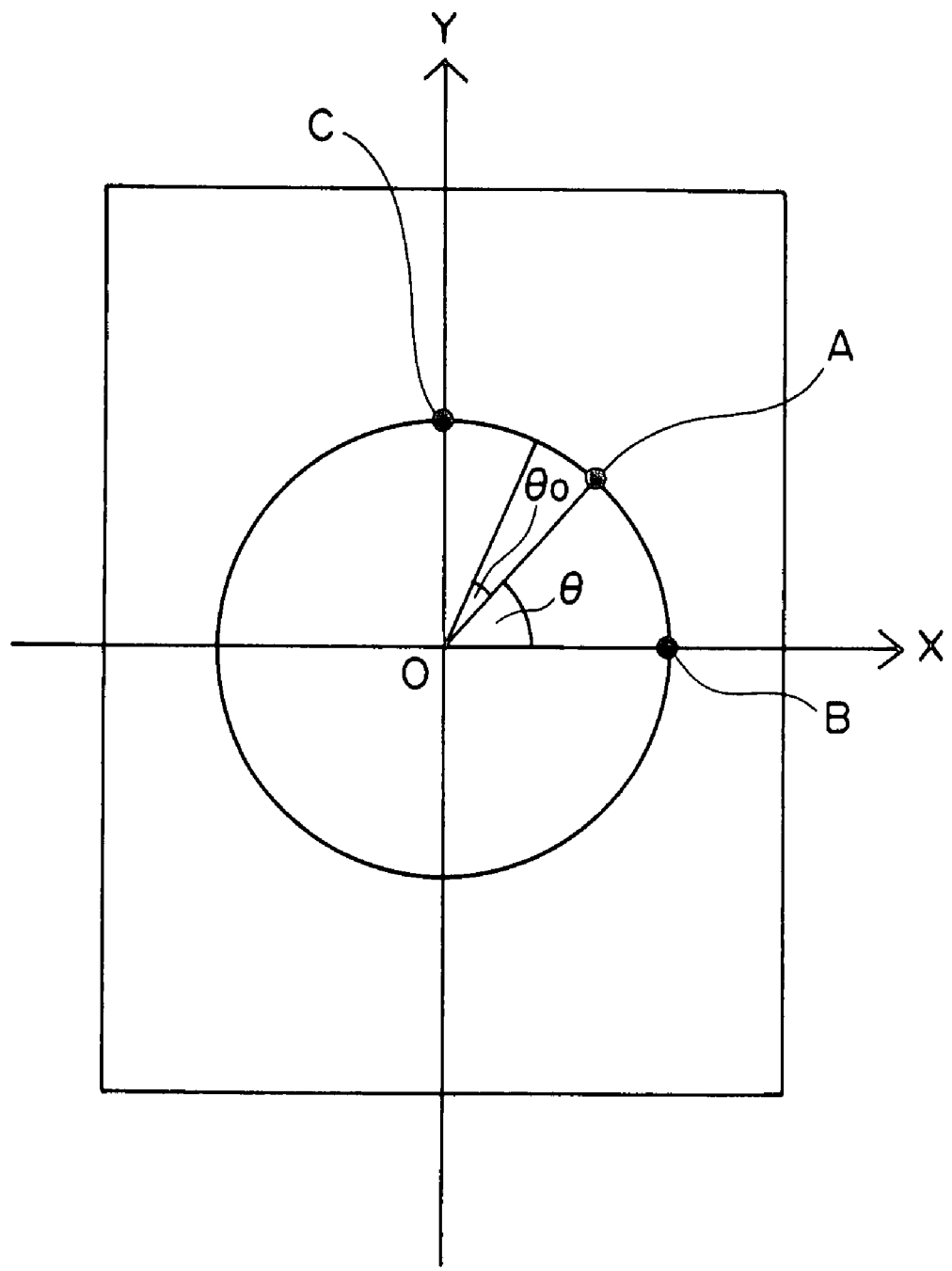
FIG. 17 is a schematic diagram for illustrating variations in the detection amount by the position of a position detector of a one-dimensional/sensor.

FIG. 17 is a schematic diagram for illustrating variations in the detection amount by the position of a position detector of a one-dimensional sensor. A coordinate system with its origin O being the center of gravity of the movable section is shown. In the case where the position detector is provided at a position A which is away from the center of gravity by the distance of r and away from the X-axis by the angle of θ°, if the position detector is moved by the angle of $θ_0°$ further away from the X-axis, the detection amount when the position detector is an X-axis direction position detector and that when the position detector is a Y-axis direction position detector are represented respectively by Expressions 7 and 8 below.

$$r \cos θ - r \cos(θ + θ_0) \quad \text{Expression 7}$$

$$r \sin(θ + θ_0) - r \sin θ \quad \text{Expression 8}$$

Therefore, in the range of $0 \leqq θ \leqq 180°$, the detection amount of the X-axis direction position detector is minimized when it is positioned at a position B of θ=0° and the detection amount of the Y-axis direction position detector is minimized when it is positioned at a position C of θ=90°. Therefore, in the case where a one-dimensional sensor is used as a position detector for either one of the driving axis directions, the position detector can be positioned on the driving axis passing through the center of gravity of the movable section, so that the mechanical resonance peak is less likely to be recognized from the control system. Thus, it is possible to broaden the closed loop control band, thereby increasing the controllability in the case where a feedback control is implemented by providing a feedback control section for performing a control based on the amount of movement. On the other hand, in the case where a two-dimensional sensor is used as a position detector, the controllability can be improved similarly if the position detector is positioned at the center of gravity of the movable section.

Figure 18A:
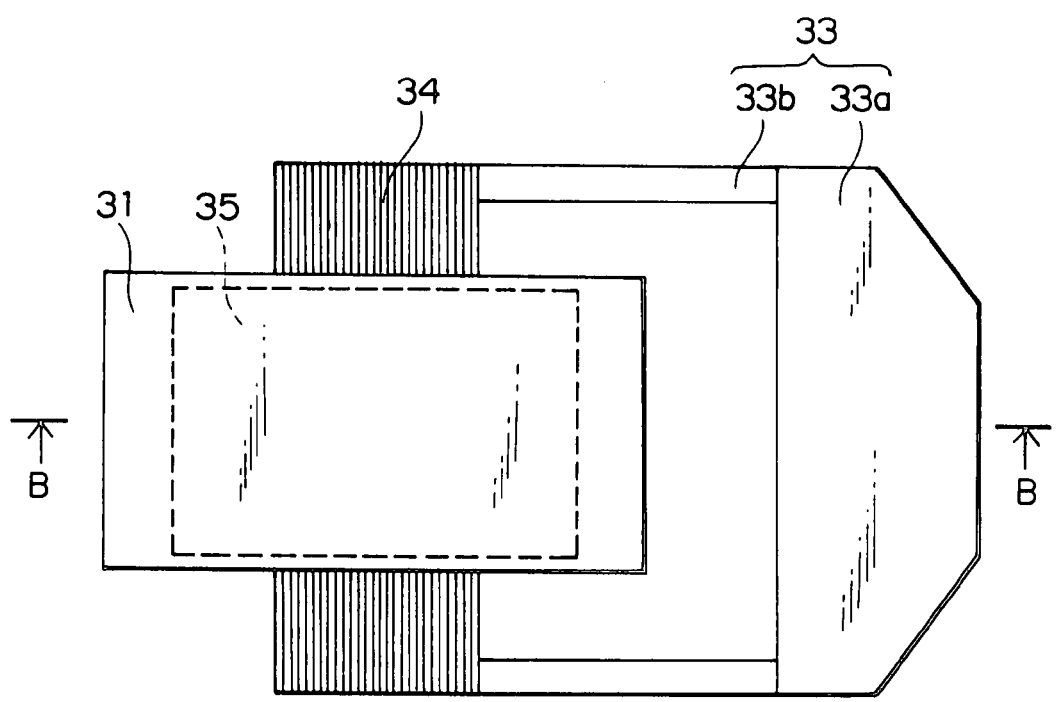
FIG. 18A and FIG. 18B are views showing the structure of another VCM.
Figure 18B:
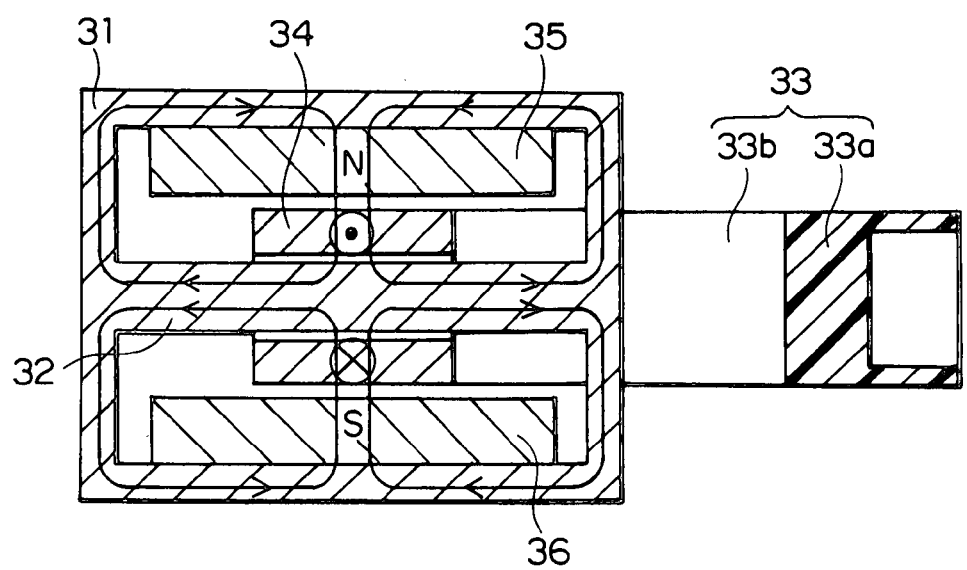

The structure of a VCM is not limited to that as shown in FIG. 6A and FIG. 6B. FIG. 18A and FIG. 18B are views showing the structure of another VCM. FIG. 18A is a plan view thereof, and FIG. 18B is a cross-sectional view of FIG. 18A along a line B-B.

The VCM includes a yoke section 31 with a shape of a rectangular tube. The yoke section 31 is fixed to a support (not shown), and has an opening passing therethrough in a lateral direction. An iron core 32 is provided so as to divide the opening into two sections at an intermediate height of the yoke section 31. The VCM also includes a movable element 33 which is connected to a movable table, and a coil 34 which is wound around the movable element 33. The coil 34 is wound so as to surround the iron core 32. The movable element 33 includes a fixed section 33a which is fixed to the movable table, and a connection section 33b for connecting the fixed section 33a with the portion around which the coil 34 is wound. The lateral length of the coil 34 is about equal to or greater than a movable range of the movable table. The movable element 33 and the coil 34 can move without a constraint in a direction perpendicular to the driving direction. A magnet 35 whose north pole faces down is attached to the inner upper surface of the yoke section 31. A magnet 36 whose south pole faces up is attached to the inner bottom surface of the yoke section 31 at a position opposing the magnet 35. Accordingly, a magnetic circuit which generates magnetic fields inside and around the coil 34 is made in the VCM.

In the thus-structured VCM, magnetic fields as indicated by arrows shown in FIG. 18B are generated. If a current flows through the coil 34 in directions shown in FIG. 18B, the movable element 33 moves in the right direction in the figure.

The linear motor is not limited to a VCM. For example, the effects of the present invention can be obtained even when an AC linear motor is used.

Although the movable table is mechanically guided by using the guide members in the above-described embodiment, an air bearing may be used as long as the center of gravity of the movable section is driven.

Figure 19:
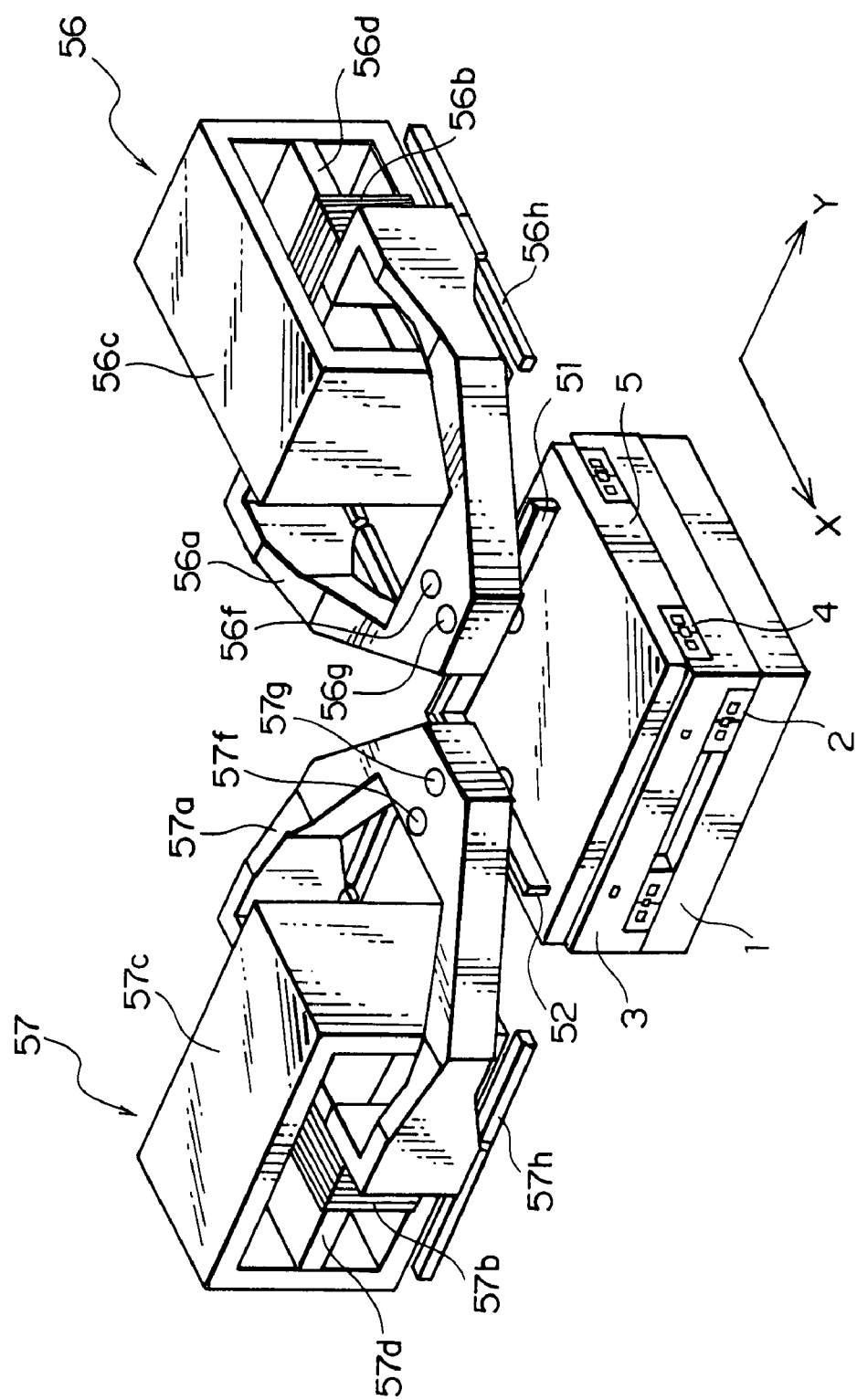
FIG. 19 is a schematic diagram showing the structure of a wire bonder stage according to a second embodiment of the present invention.

Next, the second embodiment of the present invention will be described. In the second embodiment, a movable element of an X-axis VCM and a movable element of a Y-axis VCM are not constrained by the movements of a movable table in the Y-axis and X-axis directions, respectively. FIG. 19 is a schematic diagram showing the structure of a wire bonder stage according to the second embodiment of the present invention. In the second embodiment shown in FIG. 19, the components same as those in the first embodiment shown, e.g., in FIG. 4 are denoted by the same reference numerals as those in the first embodiment, and the detailed description thereof are omitted.

In the second embodiment, a plate-shaped cam follower guide (a first protruding guide member) 51 extending in the Y-axis direction is provided along an edge of the movable table 5 in the X-axis direction, and a plate-shaped cam follower guide (a second protruding guide member) 52 extending in the X-axis direction is provided along an edge of the movable table 5 in the Y-axis direction. In the present embodiment, although the cam follower guides 51 and 52 are connected with each other as shown in FIG. 19, they may be separated from each other.

An X-axis VCM 56 is disposed at the side of the edge of the movable table 5 on which the cam follower guide 51 is provided, and a Y-axis VCM 57 is disposed at the side of the edge of the movable table 5 on which the cam follower guide 52 is provided.

The X-axis VCM 56 includes a yoke section 56c with a shape of a rectangular tube. The yoke section 56c is fixed to a support (not shown), and has an opening passing therethrough in a lateral direction. An iron core 56d is provided so as to divide the opening into two sections at an intermediate height of the yoke section 56c. The X-axis VCM 56 also includes an X-axis movable element 56a which extends above the movable table 5, and a coil 56b which is wound around the X-axis movable element 56a. The coil 56b is wound so as to surround the iron core 56d. The longitudinal and lateral lengths of the coil 56b are such that the coil 56b does not contact the iron core 56d. Two cam followers (first protruding portions) 56f and 56g which extend in the vertical direction are fixed to edge portions of the X-axis movable element 56a. The two cam followers 56f and 56g are disposed so as to interpose the cam follower guide 51 therebetween. Magnets (not shown) are attached to the inner upper surface and inner bottom surface of the yoke section 56c. Therefore, a magnetic circuit which generates a magnetic field inside and around the coil 56b is made, i.e., the X-axis VCM 56 has a structure as shown in FIG. 6. There are provided coil guides 56h which are fixed to the support at the respective sides of the yoke section 56c. The X-axis movable element 56a is moved in the X-axis direction by following the coil guides 56h.

Likewise, the Y-axis VCM 57 includes a yoke section 57c with a shape of a rectangular tube. The yoke section 57c is fixed to a support (not shown), and has an opening passing therethrough in a lateral direction. An iron core 57d is provided so as to divide the opening into two sections at an intermediate height of the yoke section 57c. The Y-axis VCM 57 also includes a Y-axis movable element 57a which extends above the movable table 5, and a coil 57b which is wound around the Y-axis movable element 57a. The coil 57b is wound so as to surround the iron core 57d. The longitudinal and lateral lengths of the coil 57b are such that the coil 57b does not contact the iron core 57d. Two cam followers (second protruding portions) 57f and 57g which extend in the vertical direction are fixed to edge portions of the Y-axis movable element 57a. The two cam followers 57f and 57g are disposed so as to interpose the cam follower guide 52 therebetween. Magnets are attached to the inner upper surface and inner bottom surface of the yoke section 57c. Therefore, a magnetic circuit which generates a magnetic field inside and around the coil 57b is made, i.e., the Y-axis VCM 57 has a structure as shown in FIG. 6. There are provided coil guides 57h which are fixed to the support at the respective sides of the yoke section 57c. The Y-axis movable element 57a is moved in the Y-axis direction by following the coil guides 57h.

In this manner, the X-axis movable element 56a and the Y-axis movable element 57a are connected to the movable table 5 via the cam followers and the cam follower guides in the second embodiment of the present invention.

Next, the operation of the thus-structured wire bonder stage of the second embodiment will be described.

When the movable table 5 is moved in the X-axis direction, the X-axis VCM 56 is driven. Accordingly, a driving force is transmitted from the cam follower 56f or 56g to the cam follower guide 51, which is fixed to the movable table 5. Therefore, the X-axis table 3 follows the X-axis guides 2, thereby being guided in the X-axis direction with respect to the base 1. Thus, the movable table 5 provided thereon is moved in the X-axis direction. At this time the cam follower guide 52 is also moved in the X-axis direction. However, the cam follower guide 52 merely passes through between the cam followers 57f and 57g without restraining them. Thus, the Y-axis movable element 57a remains still. In other words, the movable table 5 moves independently of the Y-axis VCM 57.

On the other hand, when the movable table 5 is moved in the Y-axis direction, the Y-axis VCM 57 is driven. Accordingly, a driving force is transmitted from the cam follower 57f or 57g to the cam follower guide 52, which is fixed to the movable table 5. Therefore, the movable table 5 follows the Y-axis guides 4, thereby being guided in the Y-axis direction with respect to the X-axis table 3. At this time, the cam follower guide 51 is also moved in the Y-axis direction. However, the cam follower guide 51 merely passes through between the cam followers 56f and 56g without engaging them. Thus, the X-axis movable element 56a remains still. In other words, the movable table 5 is moved independently of the X-axis VCM 56.

As described above, since the X-axis movable element 56a of the X-axis VCM 56 and the Y-axis movable element 57a of the Y-axis VCM 57 are connected to the movable table 5 via the cam followers and the cam follower guides in the second embodiment, the movable section and the movable elements of the VCMs of the respective axes can be moved independently of each other. Thus, the Y-axis movable element 57a does not need to have redundancy which realizes a wide range of its movement in the X-axis direction, and thus the Y-axis VCM 57 can be downsized. Moreover, since the Y-axis movable element 57a is not fixed to the movable table 5, in the case where a thrust in the X-axis direction with a level about same as that in the conventional case is applied to the movable table 5, the X-axis VCM 56 having a size smaller than that of the conventional X-axis VCM can be used. Therefore, the force of inertia of the movable section is reduced and the eigenfrequency thereof is increased, thereby making it possible to suppress the vibration. Furthermore, since, the movable elements of the VCMs of the respective axes are not fixed to the movable section, the mass which acts on the X-axis guides 2 and the Y-axis guides 4 is reduced. As a result, a guide with a rigidity lower than that of a conventional guide can be used for each of the X-axis guides 2 and the Y-axis guides 4, thereby making it possible to lighten the wire bonder stage itself.

Furthermore, since the X-axis movable element 56a and the Y-axis movable element 57a are connected to the upper stage section also in the second embodiment, the eigenfrequency of each of the X-axis guides 2 and the Y-axis guides 4 is increased, thereby improving the controllability. Specifically, as described above, if the total mass of the movable section which is composed of the middle stage section and the upper stage section is constant, the vibration frequency caused by the guides is minimized when the mass of the middle stage section is equal to the mass of the upper stage section. Such a structure is most disadvantageous for an XY stage. However, in the case of a wire bonder, since the bonding head is, in general, remarkably heavier than each of the other members, the total mass of the bonding head and the upper stage section is greater than the mass of the middle stage section, and the vibration frequency is large. Particularly, if both of the X-axis movable element 56a and the Y-axis movable element 57a are connected to the upper stage section as in the present embodiment, the middle stage section is further lightened with respect to the upper stage section. Therefore, the eigenfrequency is increased, and thus the controllability is remarkably improved.

Figure 20:
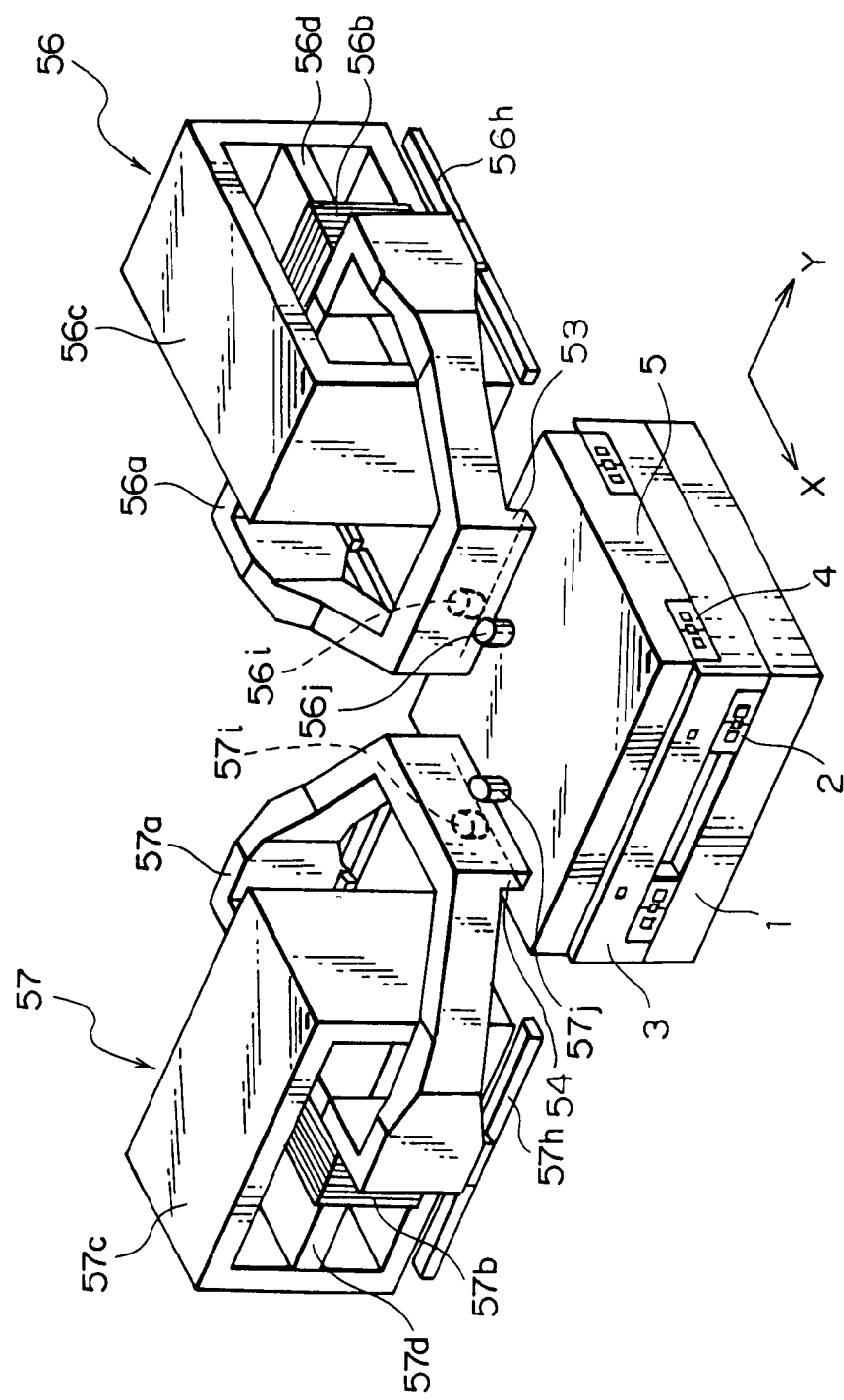
FIG. 20 is a schematic diagram showing the structure of a wire bonder stage according to a third embodiment of the present invention.

The third embodiment of the present invention will now be described. A method for connecting each VCM to a movable table in the third embodiment is different from that in the second embodiment. FIG. 20 is a schematic diagram showing the structure of a wire bonder stage according to the third embodiment of the present invention.

In the third embodiment of the present invention, two cam followers 56i and 56j are provided along an edge of the movable table 5 in the X-axis direction. The two cam followers 56i and 56j are disposed side by side in the X-axis direction. Two cam followers 57i and 57j are provided along an edge of the movable table 5 in the Y-axis direction. The two cam followers 57i and 57j are disposed side by side in the Y-axis direction.

No cam follower is provided at an edge portion of the X-axis movable element 56a. Instead, a plate-shaped cam follower guide 53 which protrudes downwardly from the edge portion is provided. The end surface of the cam follower guide 53 abuts on the movable table 5 between the cam followers 56i and 56j.

Likewise, no cam follower is provided at an edge portion of the Y-axis movable element 57a. Instead, a plate-shaped cam follower guide 54 which protrudes downwardly from the edge portion is provided. The end surface of the cam follower guide 54 abuts on the movable table 5 between the cam followers 57i and 57j.

The thus-structured third embodiment is similar to the second embodiment except that the member to which a cam follower is fixed and the member to which a cam follower guide is fixed are switched around. Thus, the same effects as those obtained in the second embodiment can be obtained by the operation same as that in the second embodiment.

Next, the fourth and fifth embodiments of the present invention will now be described. In the fourth and fifth embodiments, each movable element is connected to a movable table via a linear guide composed of a slider and a rail.

Figure 21:
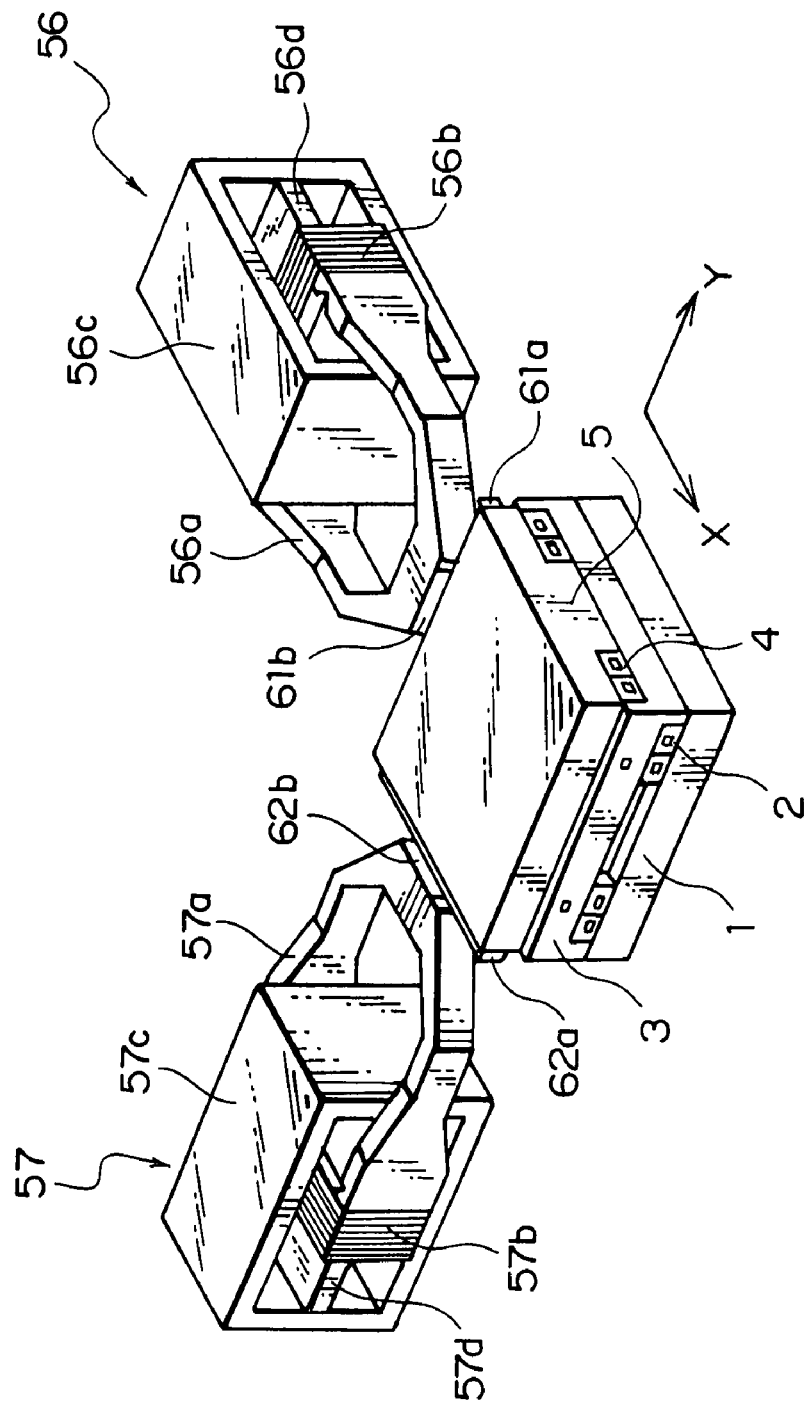
FIG. 21 is a schematic diagram showing the structure of a wire bonder stage according to a fourth embodiment of the present invention.
Figure 22:
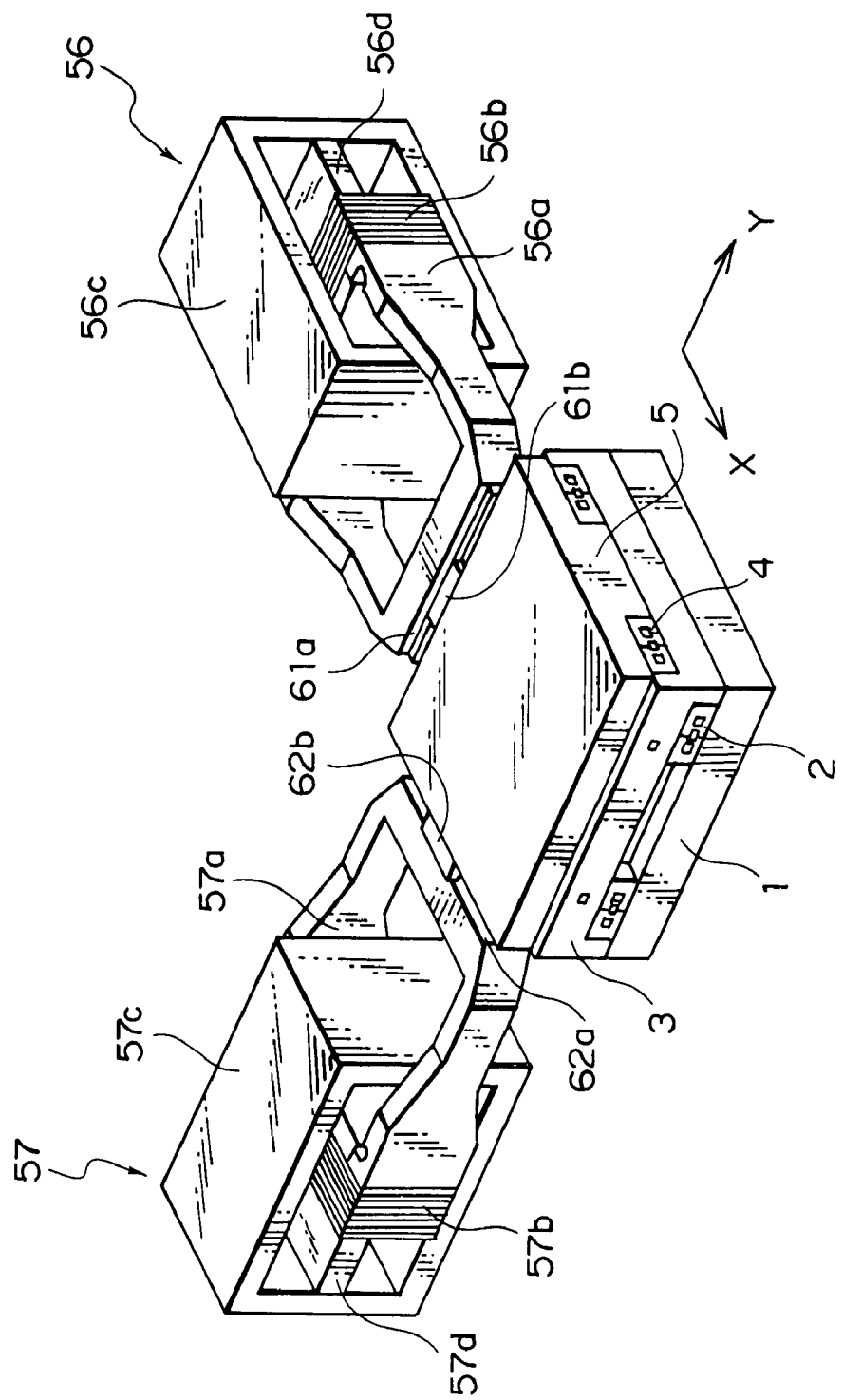
FIG. 22 is a schematic diagram showing the structure of a wire bonder stage according to a fifth embodiment of the present invention.

FIG. 21 is a schematic diagram showing the structure of a wire bonder stage according to the fourth embodiment of the present invention, and FIG. 22 is a schematic diagram showing the structure of a wire bonder stage according to the fifth embodiment of the present invention.

In the fourth embodiment, a rail 61*a* is attached to one side surface of the movable table 5 in the X-axis direction, and a rail 62*a* is attached to one side surface of the movable table 5 in the Y-axis direction. A slider 61*b* which slides by following the rail 61*a* is attached to an end surface of the X-axis movable element 56*a*. A slider 62*b* which slides by following the rail 62*a* is attached to an end surface of the Y-axis movable element 57*a*. The rail 61*a* and the slider 61*b* together constitute one linear guide, and the rail 62*a* and the slider 62*b* together constitute one linear guide. Since the linear guides are provided in this embodiment, the coil guides 56*h* and 57*h* are unnecessary.

Also in the thus-structured fourth embodiment, the Y-axis movable element 57*a* remains still when the movable table 5 moves in the X-axis direction, and the X-axis movable element 56*a* remains still when the movable table 5 is moved in the Y-axis direction. Thus, the same effects as those in the second embodiment can be obtained.

In the fifth embodiment of the present invention, the sliders 61*b* and 62*b* are attached to side surfaces of the movable table 5, and the rails 61*a* and 62*a* are attached to the end surfaces of the X-axis movable element 56*a* and the Y-axis movable element 57*a*, respectively. Since linear guides are provided also in this embodiment, the coil guides 56*h* and 57*h* are unnecessary.

The thus-structured fifth embodiment is similar to the fourth embodiment except that the member to which a slider is attached and the member to which a rail is attached are switched around. Thus, the effects same as those obtained in the second embodiment can be obtained by the operation same as that in the fourth embodiment.

A linear movement guide device other than a linear guide, e.g., a crossed roller, may be used. Although the VCM as shown in FIG. 18A and FIG. 18B is used in the second to fifth embodiments, the VCM as shown in FIG. 6A and FIG. 6B, which is used in the first embodiment, may be used. Moreover, the linear motor is not limited to a VCM as in the first embodiment. For example, the effects of the present invention can be obtained by using an AC linear motor.

While there has been described what are at present considered to be preferred embodiments of the invention, it will be understood that various modifications may be made thereto and it is intended that the appended claims cover all such modifications as fall within the true spirit and scope of the invention.

What is claimed is:

1. An XY stage, comprising:
   a base;
   a movable table disposed on said base so as to be movable in an X direction and a Y direction in an X-Y plane;
   a work member provided on said movable table;
   a first linear motor, coupled to said moveable table and said base, which gives a driving force in the X direction to said movable table at the same height as the center of gravity of a movable section composed of said movable table and said work member; and
   a second linear motor, coupled to said moveable table and said base, which gives a driving force in the Y direction to said movable table at the same height as the center of gravity of said movable section.

2. The XY stage according to claim 1, wherein said first and second linear motors are directly connected to said movable table.

3. The XY stage according to claim 1, further comprising:
   a first guide member fixed to the base and extends in the X direction;
   a middle table which is guided by said first guide member to move in the X direction; and
   a second guide member fixed to said middle table and extends in the Y direction,
   wherein said movable table is guided in the Y direction by said second guide member.

4. The XY stage according to claim 1, wherein said work member is a bonding head and is used for wire bonding.

5. The XY stage according to claim 1, wherein each of the first and second linear motors comprises:
   a fixed element fixed to a support, said fixed element having an opening with a size equal to or greater than a movable range of said movable section at the side of said movable section;
   a movable element connected to said movable table; and
   a coil wound around said movable element and inserted into said opening.

6. The XY stage according to claim 5, wherein said coil is wound with a coil axis thereof being perpendicular to a surface of said movable table.

7. The XY stage according to claim 5, wherein each of said first and second linear motors comprises a magnetic circuit which generates a magnetic field in a vertical direction within said fixed element.

8. The XY stage according to claim 7, wherein said magnetic circuit comprises at least two magnets which are disposed so that opposite poles face each other along a vertical direction.

9. The XY stage according to claim 1, wherein each of the first and second linear motors comprises:
   a fixed element fixed to a support, said fixed element having an opening running therethrough in a horizontal direction;
   a movable element connected to said movable table; and
   a coil wound around said movable element with a horizontal length equal to or greater than a movable range of said movable section, and inserted into said opening.

10. The XY stage according to claim 9, wherein said coil is wound with a coil axis thereof being parallel to the X direction or the Y direction.

11. The XY stage according to claim 1, wherein:
   each of said first and second linear motors comprises:
      a fixed element fixed to a support;
      a movable element which is connected to said movable table; and
      a coil wound around said movable element, and
   said XY stage further comprises:
      a first connection member which connects said movable element of said first linear motor to said movable table so that said movable element of said first linear motor can move in the Y direction independently of said movable table; and
      a second connection member which connects said movable element of said second linear motor to said movable table so that said movable element of said second linear motor can move in the X direction independently of said movable table.

12. The XY stage according to claim 11, wherein:
said first connection member comprises:
  two first protruding portions disposed to said movable element of said first linear motor side by side in the X direction; and
  a first protruding guide member fixed to said movable table, said first protruding guide member extending in the Y direction between said two first protruding portions, and
said second connection member comprises:
  two second protruding portions disposed to said movable element of said second linear motor side by side in the Y direction; and
  a second protruding guide member fixed to said movable table, said second protruding guide member extending in the X direction between said two second protruding portions.

13. The XY stage according to claim 11, wherein:
said first connection member comprises:
  two first protruding portions disposed to said movable table side by side in the X direction; and
  a first protruding guide member fixed to said movable element of said first linear motor, said first protruding guide member extending in the Y direction between said two first protruding portions, and
said second connection member comprises:
  two second protruding portions disposed to said movable table side by side in the Y direction; and
  a second protruding guide member fixed to said movable element of said second linear motor, said second protruding guide member extending in the X direction between said two second protruding portions.

14. The XY stage according to claim 11, wherein each of said first and second connection members is a linear movement guide device selected from the group consisting of a cross roller and a linear guide.

15. The XY stage according to claim 1, further comprising:
a first position detector coupled to one of: said moveable table and said base and disposed on a straight line extending in the x direction and passing through the center of gravity as viewed in a plan view, said first position detector detecting a movement amount of said movable section in the X direction; and
a second position detector coupled to one of: said moveable table and said base and disposed on a straight line extending in the Y direction and passing through the center of gravity as viewed in a plan view, said second position detector detecting a movement amount of said movable section in the Y direction.

16. The XY stage according to claim 15, wherein each of said first and second position detectors comprises an optical sensor.

17. The XY stage according to claim 16, wherein scale marks which respectively indicate movement amounts in the X and Y directions are provided on a surface of said base.

18. The XY stage according to claim 15, further comprising a feedback control section which controls an operation of each of said first and second linear motors based on a movement amount detected by said position detectors.

19. The XY stage according to claim 1, further comprising a position detector coupled to one of: said moveable table and said base and disposed at the position of the center of gravity as viewed in a plan view, said position detector detecting movement amounts of said movable section in the X direction.

20. The XY stage according to claim 19, wherein said position detector comprises an optical sensor.

21. The XY stage according to claim 20, wherein scale marks which respectively indicate movement amounts in the X and Y directions are provided on a surface of said base.

22. The XY stage according to claim 19, further comprising a feedback control section which controls an operation of each of said first and second linear motors based on a movement amount detected by said position detector.

23. The XY stage according to claim 1, wherein each of said first and second linear motors is an AC linear motor.

* * * * *